(12) United States Patent
Dedic et al.

(10) Patent No.: US 11,451,250 B1
(45) Date of Patent: Sep. 20, 2022

(54) SIGNAL-TO-NOISE AND INTERFERENCE RATIO (SNAIR) AWARE ANALOG TO DIGITAL CONVERTER (ADC)-BASED RECEIVER AND A METHOD THEREOF

(71) Applicant: 1-VIA LTD, Reading (GB)

(72) Inventors: Charles Joseph Dedic, Tottenham (GB); Suhas Rattan, Reading (GB)

(73) Assignee: 1-VIA LTD

( * ) Notice: Subject to any disclaimer, the term of this patent is extended or adjusted under 35 U.S.C. 154(b) by 0 days.

(21) Appl. No.: 17/738,115

(22) Filed: May 6, 2022

(51) Int. Cl.
*H04B 1/04* (2006.01)
*H04B 1/00* (2006.01)
*H04B 1/10* (2006.01)

(52) U.S. Cl.
CPC ............ *H04B 1/04* (2013.01); *H04B 1/0025* (2013.01); *H04B 1/1027* (2013.01); *H04B 2001/0416* (2013.01); *H04B 2001/0433* (2013.01); *H04B 2001/1072* (2013.01)

(58) Field of Classification Search
CPC ...... H04B 1/04; H04B 1/0025; H04B 1/1027; H04B 2001/0416; H04B 2001/0433; H04B 2001/1072
See application file for complete search history.

(56) References Cited

U.S. PATENT DOCUMENTS

| | | | |
|---|---|---|---|
| 9,276,703 B2 | 3/2016 | Shen et al. | |
| 9,699,009 B1 | 7/2017 | Ainspan et al. | |
| 9,935,664 B1 * | 4/2018 | Dai | H04B 1/1027 |
| 9,949,277 B1 | 4/2018 | Anand et al. | |
| 10,038,506 B2 | 7/2018 | Crivelli et al. | |
| 2019/0173695 A1 * | 6/2019 | Qian | H04L 25/03057 |
| 2020/0212943 A1 | 7/2020 | Banin et al. | |
| 2022/0052714 A1 * | 2/2022 | Ganesan | H04L 25/0204 |

FOREIGN PATENT DOCUMENTS

WO 2011051826 A1 5/2011

\* cited by examiner

*Primary Examiner* — Nguyen T Vo
(74) *Attorney, Agent, or Firm* — Jason C. Cameron

(57) ABSTRACT

A signal-to-noise and interference ratio (SNAIR) aware analog to digital converter (ADC)-based receiver and a method thereof is disclosed. The SNAIR aware-ADC based receiver comprises an analog front end (AFE) configured for recovering an input data signal with a bit error rate (BER) below a target BER. The SNAIR aware-ADC based receiver further comprises a sampler communicatively coupled to the AFE. A DSP unit is communicatively coupled to the SADC array. The DSP unit comprises a feed forward equalizer (FFE) configured to remove residual inter-symbol interference (ISI) by multiplying a delayed version of the digital data signal with Htap values. The CDR system is configured to process the generated plurality of error signals and data signals. An eye quality measurement system is communicatively coupled to an output of the DSP unit. A digital control communicatively coupled to each of the AFE, the sampler, the SADC array, the DSP unit, and the eye quality measurement system.

20 Claims, 23 Drawing Sheets

SIGNAL-TO-NOISE AND INTERFERENCE RATIO (SNAIR) AWARE ANALOG TO DIGITAL CONVERTER (ADC)-BASED RECEIVER AND A METHOD THEREOF

FIELD OF INVENTION

Embodiments of a present disclosure relate to receivers and more particularly to a signal-to-noise and interference ratio (SNAIR) aware analog to digital converter (ADC)-based receiver and a method thereof.

BACKGROUND

Conventional receivers adapt a signal swing to a target level (which is a fixed signal swing) in order to achieve at maximum a certain bit error rate (BER) by design. Further, the conventional receivers employ traditional analog-based topology in which data-slicers provides a single-bit or two-bit decision for non-return-to-zero (NRZ) and pulse amplitude modulation 4-level (PAM4), respectively, to digital. Therefore, in the digital, there is no room to further process data and implement digital signal processing (DSP) algorithms, clock recovery and data alignment. In conventional receivers, clock recovery and data alignment are performed based on oversampling a received symbol by 2×, which refers to double data-rate (DDR) clock data recovery (CDR). This leads to extra power-consumption in the data recovery, as in principle a single sample per symbol is sufficient to recover the data. The single sample per symbol CDR technique refers to baud-rate clock data recovery (BR-CDR) and may be very beneficial for power consumption reasons. However, such BR-CDR leads to a sub-optimal sampling point in the conventional receivers which employ traditional slicers and cannot utilize digital signal processing (DSP) algorithms efficiently.

Typically, a decision feedback equalizer (DFE) is a form of non-linear feedback equalizer and is employed to remove inter-symbol interference (ISI) due to a previous symbol (which is first post-cursor, $h_1$, as shown in FIG. 1). As the value of first post-cursor is much larger than other post-cursors, a linear equalizer (which is feed forward equalizer (FFE) and a continuous time linear equalizer (CTLE)) are not an optimum approach to remove such large post-cursor (noise and crosstalk are amplified largely to remove large $h_1$, hence, overall signal-to-noise and interference ratio (SNAIR) is degraded).

FIG. 1 is a graphical representation depicting a pulse response of a channel, in accordance with prior art. FIG. 2 is a graphical representation depicting a PAM4 eye without separation by previous symbol value referred to as a 'non-unrolled' eye, in accordance with prior art. FIG. 1 depicts the pulse response of a channel. The pulse response of a system is referred to when dealing with a feed forward equalizer (FFE) and a decision feedback equalizer (DFE). The pulse response of the system is referred to as H (also used interchangeably with lower case notation 'h') of the system. h0 is the pulse response amplitude at t=0, $h_1$ refers to t=1*Unit Interval (UI) $h_2$,t=2*UI and so on. Where unit interval is nothing but:

$$UI = \left(\frac{1}{Tb}\right) \quad \text{equation (1)}$$

Where, Tb=the symbol period for NRZ or PAM-N modulated data, where N is the number of levels being used in the PAM scheme employed in the system.

Moreover, conventionally in a PAM-4 based receiver, error signal generation is performed using four separate error samplers alongside main three decision samplers. The positions are nominally [−3−1+1+3]*h0. This is referred to as E0, E1, E2 and E3 as shown in FIG. 2. These error signals are used by the CDR and tap adaptation system. In an unrolled system, where a full set of samplers is needed for each possible previous symbol value, the number of the error samplers needed to use conventional error sampling becomes large. For example, it is nSamplers*$N^{nbits}$ where nSamplers is 7 (4 Error+3 Data), N is the PAM order and nBits is the unrolled depth. For an unrolled depth of 1 alongside the twelve (3Data*4 unrolled) data samplers, a further sixteen (4Error*4) error samplers are needed. This becomes expensive in terms of power consumption. In conventional systems, an analog front end (AFE) is optimized to set an outer eye to a target value (nominally constrained by the circuit design on certain process technology nodes, which is 7 nm, 12 nm, 16 nm, and the like). A target bit error rate (BER) is then guaranteed by design. This is inefficient as it consumes more power than needed and gives a lower BER than necessary for link operation. The conventional receivers which have a swing target and guarantee the BER by design will use more power on a signal with inherently good signal-to-noise and interference ratio (SNAIR) as the bit error rate (BER) will be well below the minimum required for the link.

Hence, there is a need for an improved signal-to-noise and interference ratio (SNAIR) aware analog to digital converter (ADC) based receiver and a method thereof to address the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

Embodiments of the present disclosure comprises a signal to noise and interference ratio (SNAIR) aware analog to digital converter (ADC) based receiver. The SNAIR aware ADC based receiver comprises an analog front end (AFE) configured for recovering an input data signal with a bit error rate (BER) below a target bit error rate (BER). The SNAIR aware ADC based receiver further comprises a sampler communicatively coupled to the AFE. The sampler is configured for receiving the input data signal from the AFE, sampling the received input data signal, and distributing the sampled input data signal to a sub-analog-to-digital converter (SADC) array. The SNAIR aware ADC based receiver further comprises the SADC array which is communicatively coupled to the sampler. The SADC array comprises an array of identical analog-to-digital converters (ADCs) configured for converting the sampled input data signal into a digital data signal. The ADCs are time-interleaved for achieving a predetermined sampling frequency. A digital signal processing (DSP) unit is communicatively coupled to the SADC array. The DSP unit uses a baud rate sampling scheme. The DSP unit comprises a feed forward equalizer (FFE) configured to remove residual inter-symbol interference (ISI) by multiplying a delayed version of the digital data signal with Htap values. The DSP unit also comprises one or more-taps decision feedback equalizer (DFE). The one or more taps DFE is configured to remove remaining ISI caused by a first y previous symbols where y is the number of DFE taps using (n−1) decision levels at each of 'n' possible previous symbols, where n is the number of levels used in a PAM scheme. The SNAIR aware ADC based receiver further comprises a baud rate sampling system communicatively coupled to the DSP unit. The baud rate sampling system is configured to generate a plurality of error signals and data signals using an output of the one or more-taps DFE. The SNAIR aware ADC based receiver further comprises a clock data recovery (CDR) system communicatively coupled to the baud rate sampling system. The CDR system is configured to process the generated plurality of error signals and data signals for aligning a main sample clock with the input data signal and maximize a corresponding eye opening. The SNAIR aware ADC based receiver further comprises an eye quality measurement system communicatively coupled to an output of the DSP unit. The eye quality measurement system is configured to measure an eye quality of the input data signal by determining a margin estimation value and corresponding outer eye measurements associated with an eye. The SNAIR aware ADC based receiver further comprises a digital control communicatively coupled to each of the AFE, the sampler, the SADC array, the DSP unit, and the eye quality measurement system. The digital control is operated by instructions from the DSP unit and is configured for auto-calibrating each of the AFE, the sampler, the SADC array, and the eye quality measurement system and optimizing performance of the AFE in order to recover the input data signal at the target BER.

Embodiments of another disclosure comprises a method for recovery of a signal transmitted over a channel using a signal to noise and interference ratio (SNAIR) aware-analog to digital (ADC)-based-receiver. The method comprises calibrating a sub-analog-to-digital converter (SADC) array for determining a gain value and an offset value for each element and also of an input data signal. The SADC array is comprised of an array of identical ADCs. Each ADC is configured for converting the input data signal into a digital data signal. The ADCs are time-interleaved for achieving a predetermined sampling frequency. The method further comprises performing initial calibrations with initial conditions to components of an analog front end (AFE). The components of the AFE are comprised of a matching network (MN), an attenuator (ATTN), a long tail equalizer (LTE), a continuous time linear equalizer (CTLE), and a variable gain amplifier (VGA). The method further comprises calibrating the CTLE and the VGA to increase an ability of the CDR system to lock by estimating a breakdown value of a power versus frequency value. The breakdown value of the power versus the frequency value is estimated using a band power measurement subsystem. Upon estimating the breakdown value of the power versus the frequency value, CTLE is calibrated until power in each band is at a target ratio, nominally equal. The method further comprises locking the CDR system with initial conditions upon calibrating the CTLE and the VGA. The method further comprises adapting Htap values of a feed forward equalizer (FFE) by correlating a plurality of error signals and a delayed input data signal. The Htap values are updated with a gain factor for maintaining calibration loop stability by using the correlated plurality of error signals and the delayed input data signal. The method further comprises centering an eye position of the input data signal by modifying a DFE feedback value at a unit interval ($h_1$) value based on a majority of votes of each sub-eye asymmetry signals. The method further comprises tuning settings of the AFE to perform at a level corresponding to at least one of a level equal to a level less than a target BER for recovering the input data signal at the target BER.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF DRAWINGS

The disclosure will be described and explained with additional specificity and detail with the accompanying figures in which.

Figure 1:
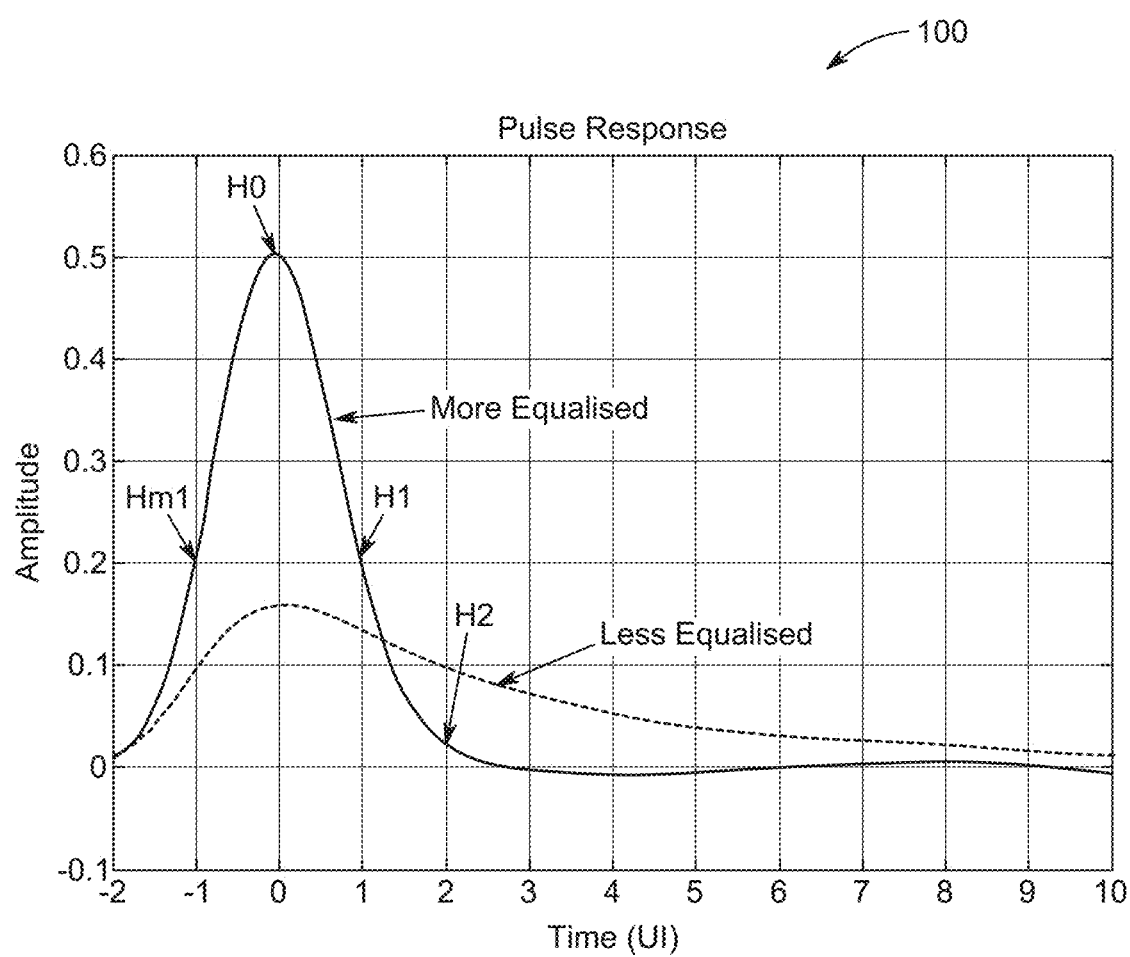
FIG. 1 is a graphical representation depicting a pulse response of a channel, in accordance with prior art.
Figure 2:
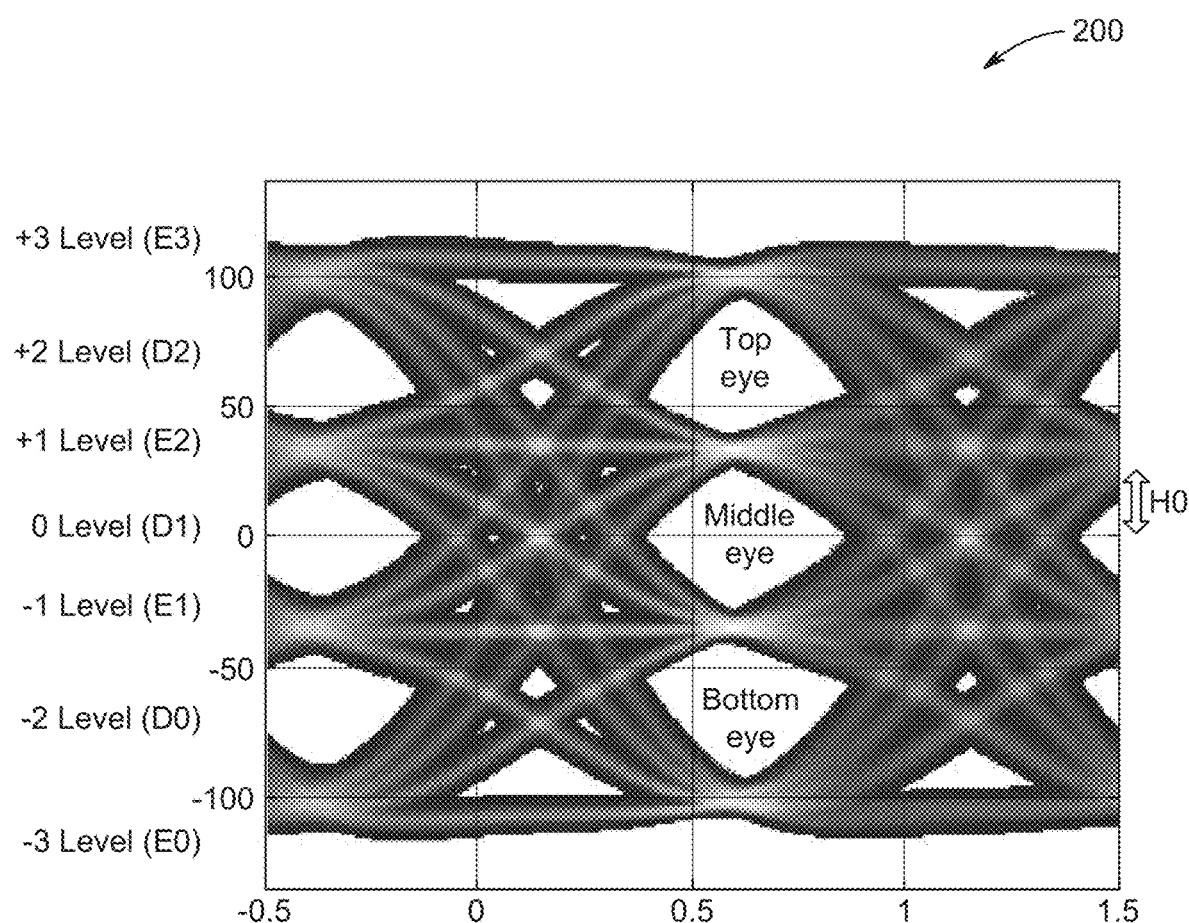
FIG. 2 is a graphical representation depicting a PAM4 eye without separation by previous symbol value referred to as a 'non-unrolled' eye, in accordance with prior art.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION OF THE DISCLOSURE

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

A computer system (standalone, client or server computer system) configured by an application may constitute a "subsystem" that is configured and operated to perform certain operations. In one embodiment, the "subsystem" may be implemented mechanically or electronically, so a subsystem may comprise dedicated circuitry or logic that is permanently configured (within a special-purpose processor) to perform certain operations. In another embodiment, a "subsystem" may also comprise programmable logic or circuitry (as encompassed within a general-purpose processor or other programmable processor) that is temporarily configured by software to perform certain operations.

Accordingly, the term "subsystem" should be understood to encompass a tangible entity, be that an entity that is physically constructed permanently configured (hardwired) or temporarily configured (programmed) to operate in a certain manner and/or to perform certain operations described herein.

Figure 3:
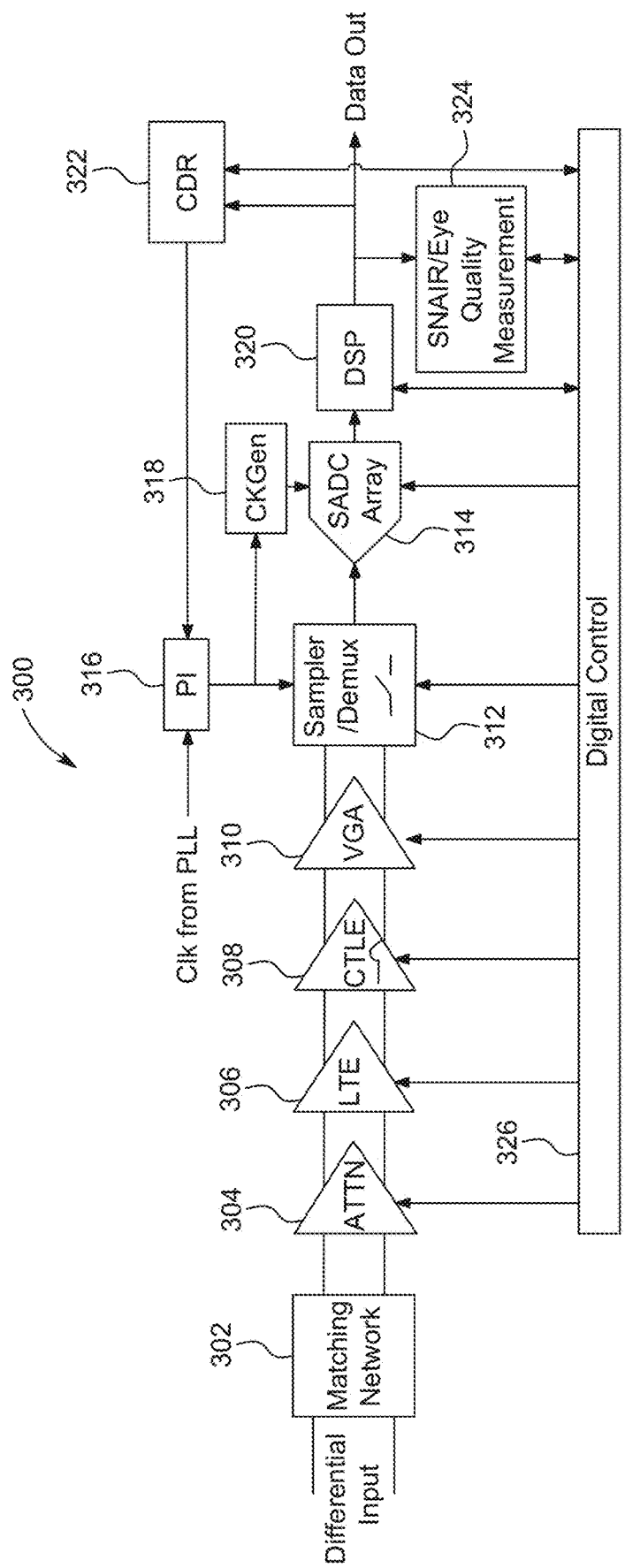
FIG. 3 is a block diagram depicting an exemplary overview of a signal to noise and interference ratio (SNAIR) aware Analog to Digital Converter (ADC) based receiver, in accordance with an embodiment of the present disclosure.

FIG. 3 is a block diagram depicting an exemplary overview of a signal-to-noise and interference ratio (SNAIR) aware Analog to Digital Converter (ADC) based receiver 300, in accordance with an embodiment of the present disclosure. The SNAIR aware ADC based receiver 300 comprises an analog front end (AFE) configured for recovering an input data signal with a bit error rate (BER) below a target BER. The SNAIR aware ADC based receiver 300 is optimised such that the BER is below (slightly better than for example, within half of 1 order of magnitude, that for a BER target of 1e-6, which corresponds to a BER range from 1e-6 to 5e-7) the target so as to minimise the power used in the AFE. The AFE comprises a matching network (MN) 302 configured for controlling a differential input impedance as compared to a predetermined value. The MN 302 ensures that a differential input is terminated with a correct impedance. By terminating the input to an optimum impedance, maximum energy is received in the AFE, and a reflected power may be minimized This leads to a less inter symbol interference and a better signal-to-noise and interference ratio (SNAIR). The AFE further comprises an attenuator (ATTN) 304 communicatively coupled to an output of the MN 302. The ATTN 304 is configured for attenuating the input data signal into a predetermined range to ensure linearity of the input data signal. An amount of attenuation is dependent upon a predetermined signal-swing value. The amount of attenuation is calibrated at a link start-up using a digital signal processing (DSP) unit 320. The ATTN 304 is utilized to reduce swing of a large input signal (typically in low loss channels and high swing driver cases) into a range suitable in terms of linearity for the following circuits to make sure they are not saturated and lead to clipping or distortion. The amount of attenuation depends on channel-loss or signal-swing and is automatically calibrated or adjusted by a DSP algorithm at the link start-up. The AFE, further comprises a long tail equalizer (LTE) 306 communicatively coupled to an output of the ATTN 304. The LTE 306 is configured to equalize low-frequency content in the input data signal and generate a long tail in the pulse response of the input data signal. The LTE 306 is calibrated at the link start-up and in a mission mode using the DSP unit 320. The LTE 306 is utilized to equalize low frequency content in a channel with skin effect which is prominent in lower frequencies (<1 GHz) and tends to cause a long tail (that is the pulse takes longer to settle) in the pulse response of the channel. The LTE 306 is automatically calibrated or adjusted at start-up of the link as well as in the mission mode (that is when live data is running through the link) through the DSP algorithm. This provides an optimum performance over process, voltage, and temperature (PVT) and channel-loss.

The AFE further comprises a continuous time linear equalizer (CTLE) 308 communicatively coupled to an output of the LTE 306. The CTLE 308 is configured to equalise an incoming input signal by attenuating the low frequency content of the input data signal whilst boosting the Nyquist frequency content of the input data signal. The CTLE 308 is auto-calibrated using the DSP unit 320. The CTLE 308 is utilized to counteract loss in the channel to help recover the signal. The CTLE 308 does this by attenuating the low frequency content of the received signal between DC and the maximum frequency content of the signal (also referred to as the peak frequency) by a variable amount. The purpose of the CTLE 308 is that the frequency content of the recovered signal after the CTLE 308 is at a target ratio, nominally equal, from a direct current (DC) to a peak frequency. Therefore, this reduces inter-symbol interference (ISI) in front of an ADC and conditions the signal as to improve the ability of the CDR to lock. The CTLE auto-calibration is performed through the DSP algorithm and continuously runs in the background to counteract process, voltage, and temperature (PVT) and channel-loss variation. The AFE further comprises, a variable gain amplifier (VGA) 310 communicatively coupled to an output of the CTLE 308. The VGA 310 is configured to boost the signal swing value of the input data signal to a level in order for SNAIR to correspond to the target BER. The VGA 310 is configured during link start up to boost the signal swing value of the input data signal to a predetermined threshold level for obtaining a predetermined swing level such that the CDR can achieve lock. The VGA 310 is adapted during mission mode to maintain the signal swing at a desired level in order obtain a certain SNAIR corresponding to the target BER.

The SNAIR aware ADC based receiver 300 further comprises a sampler 312. The sampler 312 is communicatively coupled to the analog front end (AFE). The sampler 312 is configured for receiving the input data signal from the analog front end (AFE), sampling the received input data signal, and distributing the sampled input data signal to a sub-analog-to-digital converter (SADC) array 314. The sampler 312 collects the incoming signal and samples it and then distributes it to the SADC array 314. There is an array of identical ADCs which convert the incoming samples into a digital signal. The ADCs are time interleaved to achieve the desired sampling frequency. Therefore, this reduces the speed requirement for each ADC. The SADC array 314 is communicatively coupled to the sampler 312. The SADC array 314 comprises an array of identical analog-to-digital converters (ADCs) configured for converting the sampled input data signal into the digital data signal. The analog-to-digital converters (ADC's) are time-interleaved for achieving a predetermined sampling frequency. Each individual ADC is referred to as the SADC array 314 as each of them forms a sub-component of the analog-to-digital converter (ADC) array. The SNAIR aware ADC based receiver 300 further comprises the DSP unit 320. The DSP unit 320 is communicatively coupled to the sub-analog-to-digital converter (SADC) array 314. The DSP unit 320 uses a baud rate sampling scheme. The DSP unit 320 comprises a feed forward equalizer (FFE) configured to remove residual inter-symbol interference (ISI) by multiplying a delayed version of the digital data signal with Htap values and one or more-taps decision feedback equalizer (DFE) is configured to remove remaining ISI caused by a first y previous symbols where y is the number of DFE taps using (n−1) decision levels at each of 'n' possible previous symbols, where n is the number of levels used in a PAM scheme. The digital signal processing (DSP) unit 320 further comprises a linearity calibration system configured to determine whether the input data signal at an input of a sub-analog-to-digital converter (SADC) array 314 comprises a non-linearity condition above a predetermined threshold value and is configured to attenuate the signal swing value of the input data in the event that the non-linearity exceeds the predetermined threshold value. Further, the digital signal processing (DSP) unit 320 is configured to respond to the input data signal at the input of the sub-analog-to-digital converter (SADC) array 314.

Figure 9:
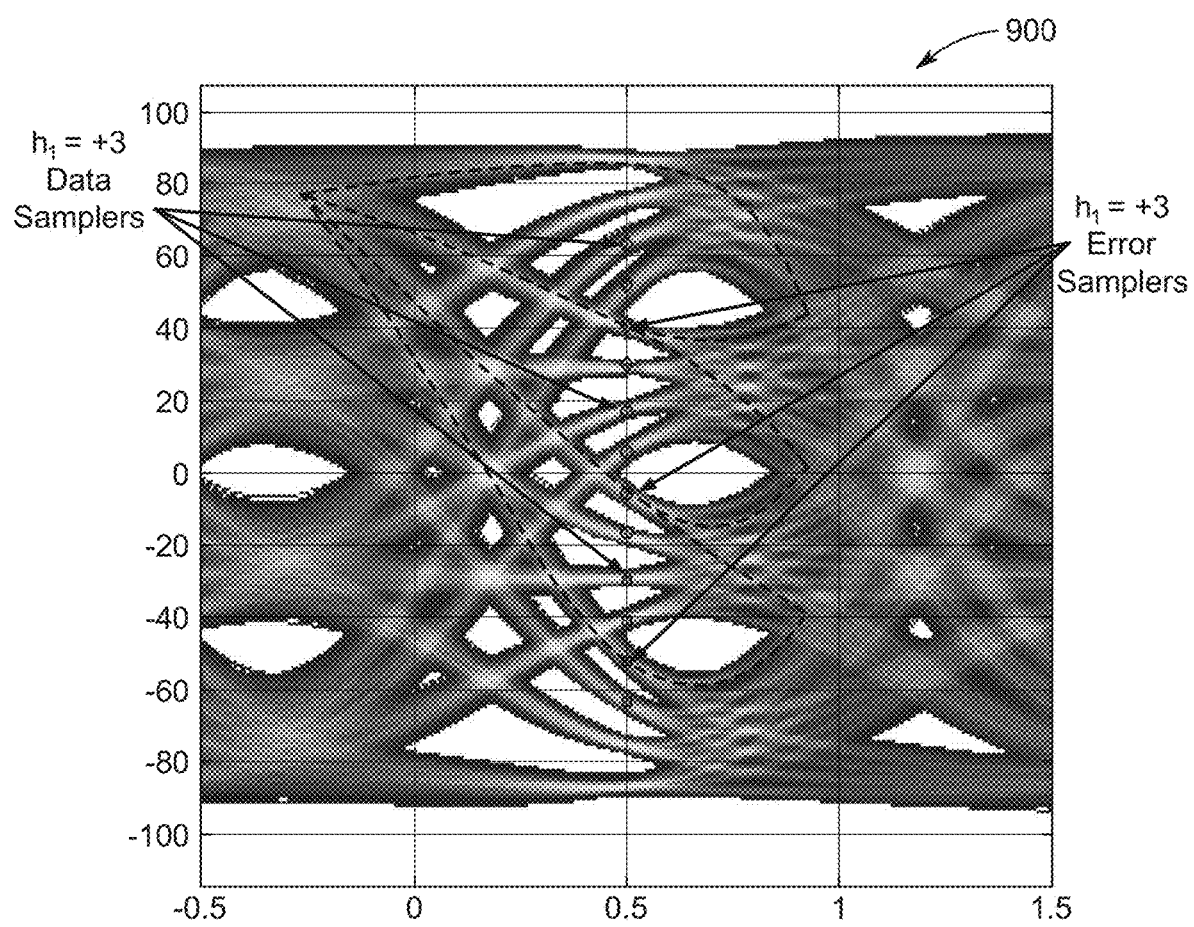
FIG. 9 is a graphical representation depicting an exemplary error generation for a pulse amplitude modulation (PAM)-4 system, in accordance with an embodiment of the present disclosure.

The SNAIR aware ADC based receiver 300 further comprises a baud rate sampling system communicatively coupled to the digital signal processing (DSP) unit 320. The baud rate sampling system is configured to generate a plurality of error signals and data signals using an output of the one or more-taps decision feedback equalizer (DFE). A clock data recovery (CDR) system 322 is communicatively coupled to the baud rate sampling system. The baud rate sampling system is further configured to de-multiplex one or more comparator outputs such that a data sample and an error sample are generated for each symbol of the input data signal by utilising a previous symbol decision and generate the plurality of error signals by re-using at least one of a set of predetermined unused data decisions along with a d(n−1)*$h_1$ value (as depicted in FIG. 9). Conventional state of the art receivers has separate data and error samplers. The plurality of error signals are generated for a maximum number of possible transitions in the input data signal. The baud rate sampling system uses a baud rate architecture.

The SNAIR aware ADC based receiver 300 further comprises the CDR system 322 configured to process the generated plurality of error signals and data signals for aligning a main sample clock with the input data signal and maximize a corresponding eye opening. The CDR system 322 is further configured to track the phase and frequency of the input data signal continuously and determine an optimum sampling time for each received symbol of the input data signal. The CDR system 322 further comprises a phase detector configured to transform the generated plurality of error signals and data signals into a subset of a set comprising: early votes, late votes, and no votes. A voter is configured to aggregate votes that are output from the phase detector. The voter determines a most common vote amongst the aggregated votes. The voter forwards the determined most common vote to a first order digital filter. The first order digital filter is configured to generate a first input gain for a proportional path and a second input gain for an integral path. An output of the first order digital filter is integrated to provide a phase interpolator (PI) code. The CDR system 322 may further utilise an independent decision feedback equalizer (DFB) from a main data path allowing the CDR $h_1$ to be set independently of a data path $h_1$ correction. This allows for the sampling point to be set optimally without compromising the main data path BER.

The SNAIR aware ADC based receiver 300 further comprises an eye quality measurement system 324 communicatively coupled to an output of the digital signal processing (DSP) unit 320. The eye quality measurement system 324 is configured to measure the eye quality of the input data signal by determining a margin estimation value and corresponding outer eye measurements associated with the eye. The signal-to-noise and interference ratio (SNAIR) aware analog-todigital converter (ADC) based-receiver 300 is respondent to measuring the eye quality of the input data signal by determining the margin estimation value and the corresponding outer eye measurements associated with the eye. The eye quality measurement system 324 is further configured to split the input data signal to obtain an up-margin value and a down-margin value for a plurality of sub-eyes, adapt one or more threshold values associated with the up-margin value and the down-margin value. The threshold values are adapted such that the correspond to programmable bit error rate (BER) threshold values, these values are used to determine an upBER value and a downBER value at a sample point corresponding to each of the up-margin values and the down-margin values by extrapolating probabilities threshold value and adapted threshold values associated with the up-margin value and the down-margin value and determine the margin estimation value of the eye based on the determined upBER value and the downBER value. The SNAIR aware ADC based receiver 300 further comprises a digital control 326 communicatively coupled to each of the AFE, the sampler 312, the SADC array 314, the DSP unit 320, and the eye quality measurement system 324. The digital control 326 is operated by instructions from the DSP unit 320 and is configured for auto-calibrating each of the AFE, the sampler 312, the SADC array 314, and the eye quality measurement system 324 and optimizing performance of the analog front end (AFE) to recover the input data signal at the target BER. The digital control 326 comprises a plurality of subsystems in the form of programmable instructions executable by the DSP unit 320. The plurality of subsystems comprises an adaptation subsystem configured to calibrate each element of the sub-analog-to-digital converter (SADC) array 314 by determining a gain value and an offset value. The preadaptation subsystem is further configured to perform one or more initial calibrations with initial conditions to components of the AFE and calibrate the CTLE 308 and the VGA 310 to increase an ability of the CDR system 322 to lock by estimating a breakdown value of a power versus frequency value. The breakdown value of the power versus the frequency value is calculated using a band power measurement subsystem. Upon calculating the power versus frequency value of the sampled data, the CTLE 308 is calibrated until power in each band is related by a programmable target ratio. The band power measurement subsystem is configured at link start-up to filter the input data signal with a digital high-pass filter and a low-pass filter. Results of the high-pass filter are sent to a power measurement block. In an exemplary embodiment, The filtered input signal may be used to generate a power signal from a Fnyquist/2 to a Fnyquist value. The Fnyquist value may correspond to a sample rate/2. Results of the low-pass filter which may be of any order filter, such as but not limited to first order, are decimated by a factor of two and filtered using a second high-pass filter and low-pass filter which may be of any order filter such as but not limited to first order, in a recursive arrangement to measure one or more frequency bands of interest. In an embodiment, any other higher order filters and decimation factors may also be used alternatively. The CDR locking subsystem is configured to lock the CDR system 322 with a set of initial conditions. The clock data recovery (CDR) locking subsystem is configured to increase an acquisition range of a clock data recovery (CDR) loop using a higher clock data recovery (CDR) proportional (1st order) path gain (Kprop) value, while maintaining clock data recovery (CDR) loop stability. The plurality of subsystems further comprises a tap estimation subsystem. The tap estimation subsystem is configured to adapt the Htap values of the feed forward equalizer (FFE) by correlating the generated plurality of error signals and the delayed input data signal. The Htap values are updated with a gain factor for maintaining a calibration-loop stability by using the correlated plurality of error signals and the delayed input data signal. The plurality of subsystems further comprises an eye-centering subsystem configured to center a sampling position of the input data signal by modifying the DFB correction value corresponding to the first previous symbol based on a majority of votes of each sub-eye asymmetry signals. Sub-eye asymmetry is an imbalance between the up margin/BER and down margin/BER signals for a particular sub-eye. The plurality of subsystems further comprises an analog front end (AFE) tuning subsystem configured to tune the settings of the AFE to perform at a level corresponding to a level less than or equal to the target bit error rate (BER) for recovering the input data signal at the target BER. The CDR subsystem is configured to align the eye position by adjusting the DFE correction value based on a majority vote of the eye asymmetry signals. The digital control 326 is configured to monitor signal-to-noise and interference ratio (SNAIR) during operation and adapt to a predetermined threshold signal-to-noise and interference ratio (SNAIR) target value for adapting across process, voltage, and temperature (PVT) variations. The SNAIR aware ADC based receiver 300 further comprises the PI 316 communicatively coupled to the sampler 312 and the CDR system 322. The PI 316 is configured to rotate an input clock from at least one subset of a set comprising a phase-locked-loop (PLL) and a clock source to a specified phase relationship. The PI 316 is controlled by control loop which is at least first order implemented in the digital control 326. If the eye quality measurement system 324 detects a non-linearity condition above a predetermined threshold value, the AFE is instructed to attenuate the signal swing value of the input data signal such that the linearity requirements are fulfilled.

The SNAIR aware ADC based receiver 300 further comprises a clock generation 318 system communicatively coupled to the sub-analog-to-digital converter (SADC) array 314. The clock generation system 318 is configured to generate a specific lower frequency clock signal from a main sample clock derived from the CDR system 322 and the clock source. The PI 316 allows an input clock from the phase-locked-loop (PLL) to be rotated to a specified phase relationship. This allows the CDR system 322 to track the phase of the incoming data continuously and find the optimum sampling time for each received symbol. The PI 316 is automatically controlled by an at least first-order loop implemented in digital by an efficient digital signal processing (DSP) algorithm to govern the optimum sampling point. The individual sub-analog-to-digital converters require sequencing and specific lower frequency clocks that this block generates from the main sample clock which derived from the CDR system 322 and phase-locked-loop (PLL).

Figure 4:
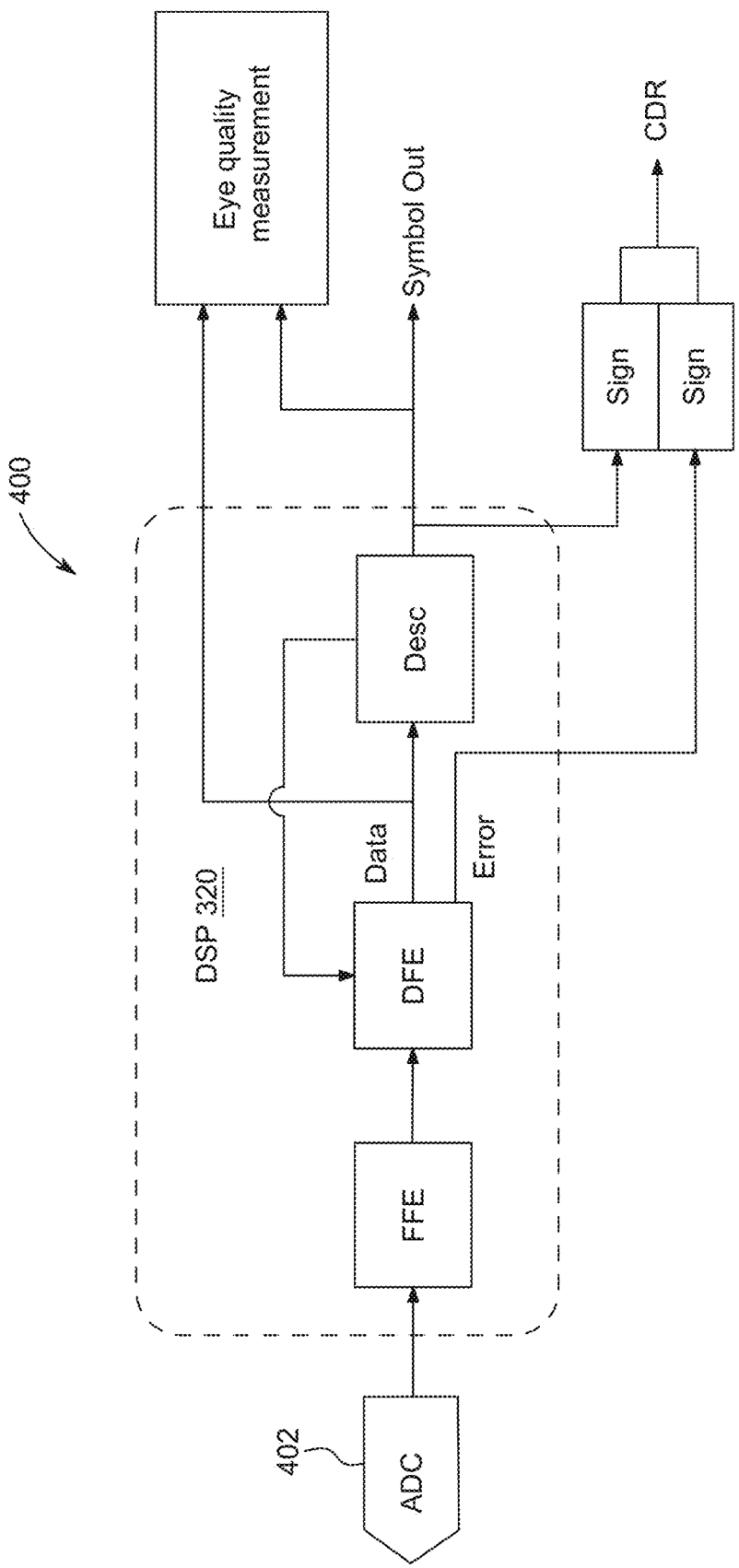
FIG. 4 is a block diagram depicting an overview of a digital signal processing (DSP) unit, in accordance with an embodiment of the present disclosure.

FIG. 4 is a block diagram 400 depicting an overview of a digital signal processing (DSP) unit 320, in accordance with an embodiment of the present disclosure. A SNAIR aware ADC based receiver 300 utilizes a baud rate sampling scheme. This is advantageous over a standard double data rate method which samples both the data and the transition as it needs half the sampling rate which means has significantly lower power. By guaranteeing the signal-to-noise and interference ratio (SNAIR) of the signal at the input of the sampler 312, it also relaxes the resolution requirements (that is number of effective bits) for an analog-to-digital converter (ADC) 402 which again saves power and area.

Figure 5:
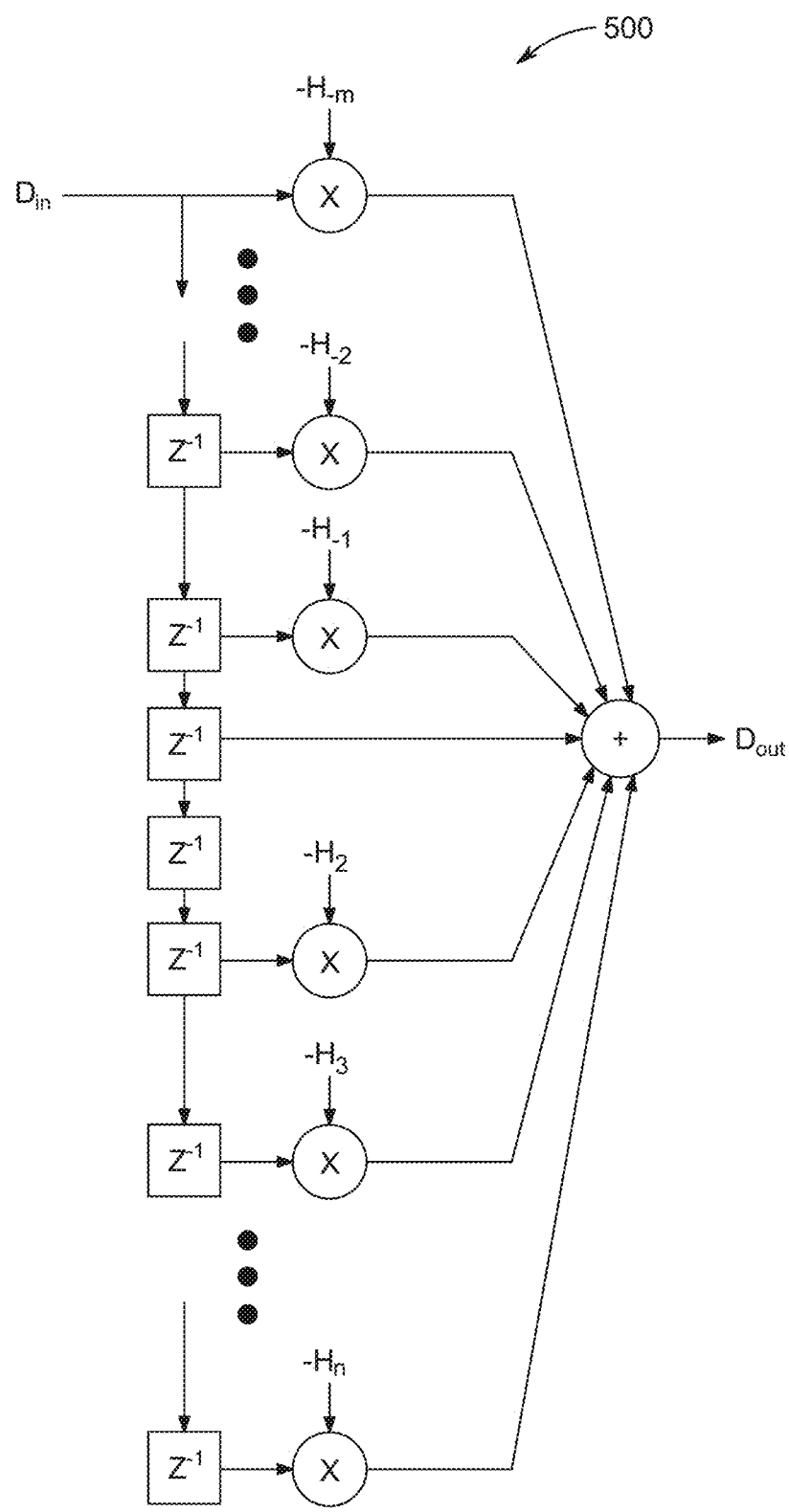
FIG. 5 is a block diagram depicting an exemplary feed forward equalizer (FFE), in accordance with an embodiment of the present disclosure.

FIG. 5 is a block diagram depicting an exemplary feed forward equalizer (FFE) 500, in accordance with an embodiment of the present disclosure. After the analog front end (AFE), there is residual inter symbol interference (ISI). The residual inter symbol interference (ISI) should be removed. This removal of residual inter symbol interference (ISI) is performed with the help of the FFE 500. To achieve this, a delayed version of the data stream is multiplied by HTAP values. The mechanism for the HTAP value adaption is explained in tap adaption section. The FFE 500 is a linear equalizer and does not rely on feedback.

Figure 6:
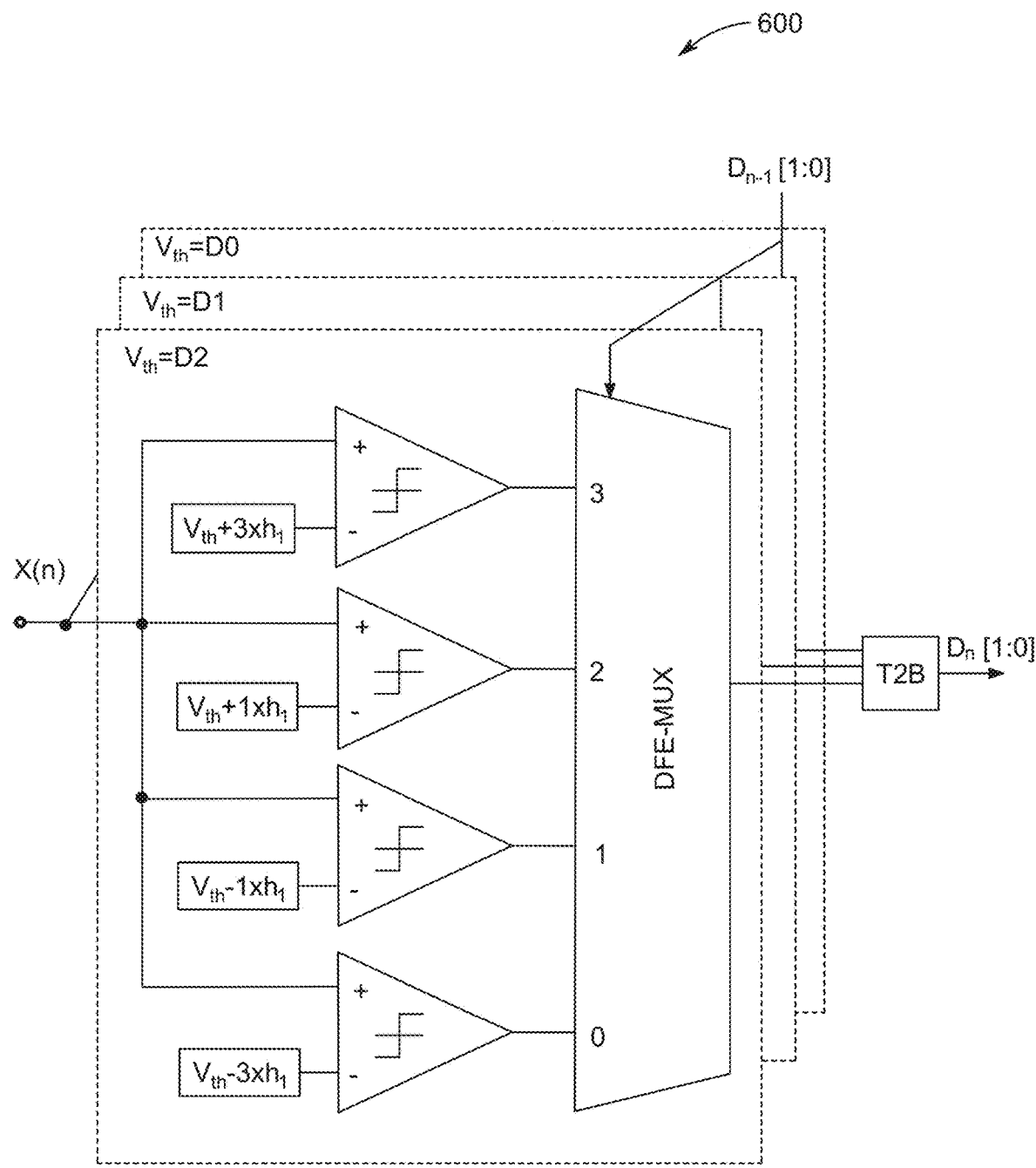
FIG. 6 is a block diagram depicting an exemplary one-tap unrolled decision feedback equalizer (DFE), in accordance with an embodiment of the present disclosure.

FIG. 6 is a block diagram depicting an exemplary one-tap unrolled decision feedback equalizer (DFE) 600, in accordance with an embodiment of the present disclosure. Utilizing the decision feedback equalizer (DFE) 600, $h_1$ may be effectively removed without any noise or crosstalk amplification. In this case, X(n) is the multi-level signal coming from FFE 500. These three levels (which is D0, D1, D2) may be individually adapted through a digital signal processing (DSP) algorithm to provide a robust performance over process, voltage, and temperature (PVT). As the DFE 600 is a feedback system, the timing is considered carefully if a conventional direct DFE is utilized. To alleviate timing constrains in digital implementation, a one-tap loop-unrolling architecture is employed. In this approach, all the possible inter-symbol interference (ISI) due to first postcursor are precomputed that is $3*h_1$, $-1*h_1$, $+1*h_1$, $+3*h_1$ and based on the previous symbol that is d(n−1), the right precomputed value is employed. The unrolling eye approach necessitates four comparators such as digital magnitude comparator per each data threshold level that is D2, D1, D0. Therefore, overall, twelve comparators are present for one symbol. The signal-to-noise and interference ratio (SNAIR) aware ADC based receiver 300 is responsive to removing the ISI caused by the first previous y previous symbols where y is the number of DFE taps using the (n−1) decision levels at each of 'n' possible previous symbols, where n is the number of levels used in a PAM scheme. The one or more taps DFE is configured to predetermine the inter-symbol interference (ISI) caused due to the first previous symbol and to determine a final data value based on the previous symbol decision d(n−1) and a current raw ADC output value is used to calculate d(n), where n is a number of symbols.

Figure 7:
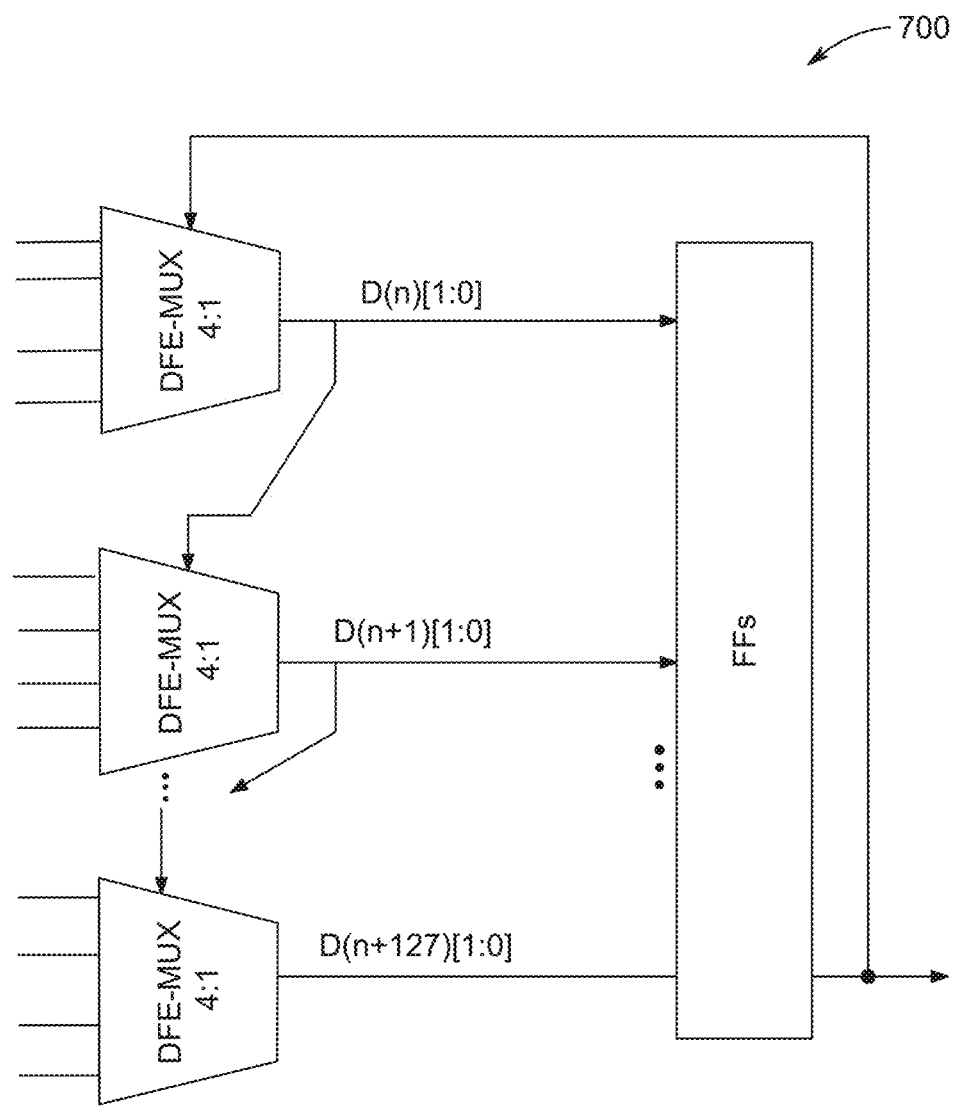
FIG. 7 is a block diagram depicting an exemplary one hundred and twenty eight pipeline implementation, in accordance with an embodiment of the present disclosure.

FIG. 7 is a block diagram depicting an exemplary one hundred and twenty eight pipeline implementation 700, in accordance with an embodiment of the present disclosure. Digital implementation relies on parallelizing a high-speed path into multiple parallel low-speed path such that an aggregate data-rate remains same. However, maximum speed of each path remains below 400 MHz to allow a fully standard cell based digital implementation and to reduce power consumption. Such an implementation is depicted in the FIG. 7.

Figure 8:
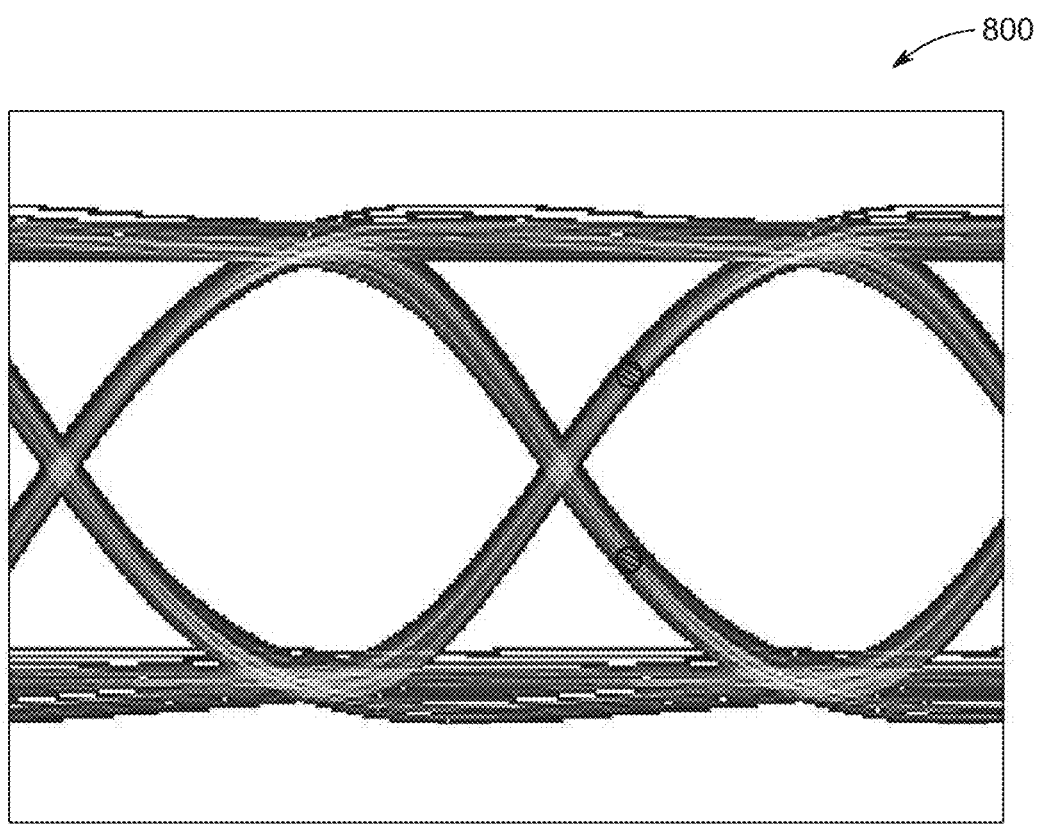
FIG. 8 is a graphical representation depicting reuse of a sampler in an NRZ system, in accordance with an embodiment of the present disclosure.

FIG. 8 is a graphical representation depicting reuse of a sampler 312 in an NRZ system, in accordance with an embodiment of the present disclosure. In order to reduce number of samplers 312 needed, some of the precomputed samples are re-used. The unused decision plus $n*h_1$ values is utilized to generate an error signal. In an NRZ system, one sampler 312 is data, and the other sampler 312 is an error. They are de-muxed by the previous symbol decision. By utilising the unused decision to generate an error signal, the required sample rate and power is half than that of a double data rate (DDR) system. This creates two unrolled sub-eyes (up and down), and the sampling position is controlled by modifying the $h_1$ correction value. In this setup, it is sub optimal to completely cancel the $h_1$ using the AFF, as a certain value of residual $h_1$ is desired to bring the lock point to a more central point of the unrolled eyes.

In an embodiment, an error generation table is depicted in Table 1. A scheme for reusing the precomputed decision is proposed. It generates an error signal for twelve of sixteen possible transitions giving it a high tracking rate as conventional systems which utilizes smooth transitions only four or eight of sixteen total transitions. The present inventions' error generation scheme utilizes more transitions and different decision samplers. This target is more than just the smooth transitions. Therefore, all the possible transitions are considered, and the system has more votes to react upon them. This increases CDR system's 322 tracking bandwidth and hence, improves the jitter tolerance of the SNAIR aware ADC based receiver 300. By utilizing the proposed method, there is no need to add an extra sixteen error comparators and the CDR system's 322 tracking bandwidth is improved. Moreover, due to the digital signal processing (DSP) algorithms, all the threshold levels may be calibrated in the background and the CDR system's 322 sampling phase remains at its optimum value over process, voltage, and temperature (PVT). The table 1 is novel and is representative of a pulse amplitude modulation 4 (PAM 4) system, however the table 1 can be generalized for a PAM-N system, where N is the number of levels utilized in the PAM system.

TABLE 1

| d(n − 1) | d(n) | Error Sampler (h1/h0) | Error Sampler (name) | Decision Sampler (h1/h0) | Decision sampler (name) |
|---|---|---|---|---|---|
| +3 | +3 | N/A | N/A | +3/+2 | +3 Top eye |
| +3 | +1 | −1/+2 | −1 Top eye | +3/+2 | +3 Top eye |
| +3 | −1 | −1/0 | −1 Mid Eye | +3/0 | +3 Mid eye |
| +3 | −3 | −1/−2 | −1 Bottom eye | +3/−2 | +3 Bottom eye |
| +1 | +3 | N/A | N/A | +1/+2 | +1 Top eye |
| +1 | +1 | −3/+2 | −3 Top eye | +1/+2 | +1 Top eye |
| +1 | −1 | −3/0 | −3 Mid Eye | +1/0 | +1 Mid eye |
| +1 | −3 | −2/−2 | −3 Bottom eye | +1/−2 | +1 Bot eye |
| −1 | +3 | +3/+2 | +3 Top eye | −1/+2 | −1 Top eye |
| −1 | +1 | +3/0 | +3 Mid eye | −1/0 | −1 Mid eye |
| −1 | −1 | +3/−2 | +3 Bottom eye | −1/−2 | −1 Bot eye |
| −1 | −3 | N/A | N/A | −1/−2 | −1 Bot eye |
| −3 | +3 | +1/+2 | +1 Top eye | −3/+2 | −3 Top eye |
| −3 | +1 | +1/0 | +1 Mid eye | −3/0 | −3 Mid eye |
| −3 | −1 | +1/−2 | +1 Bottom eye | −3/−2 | −3 Bot eye |
| −3 | −3 | N/A | N/A | −3/−2 | −3 Bot eye |

FIG. 9 is a graphical representation depicting an exemplary error generation 900 for a pulse amplitude modulation (PAM)-4 systems, in accordance with an embodiment of the present disclosure. The dashed line represents the three sub eyes for when the previous symbol is +3. The points represent the decision levels for all twelve of the unrolled DFE samplers. Annotated are the samplers utilised when the previous symbol D(n−1) is +3. The decision samplers are used to determine the current symbol value and are used when referring to the +3 top, middle and bottom sub eyes. The error samplers are utilized to generate the error signals for use in the CDR and other parts of the DSP. For different previous symbols the selection of which of the 12 samplers are used is described in Table 1.

Figure 10:
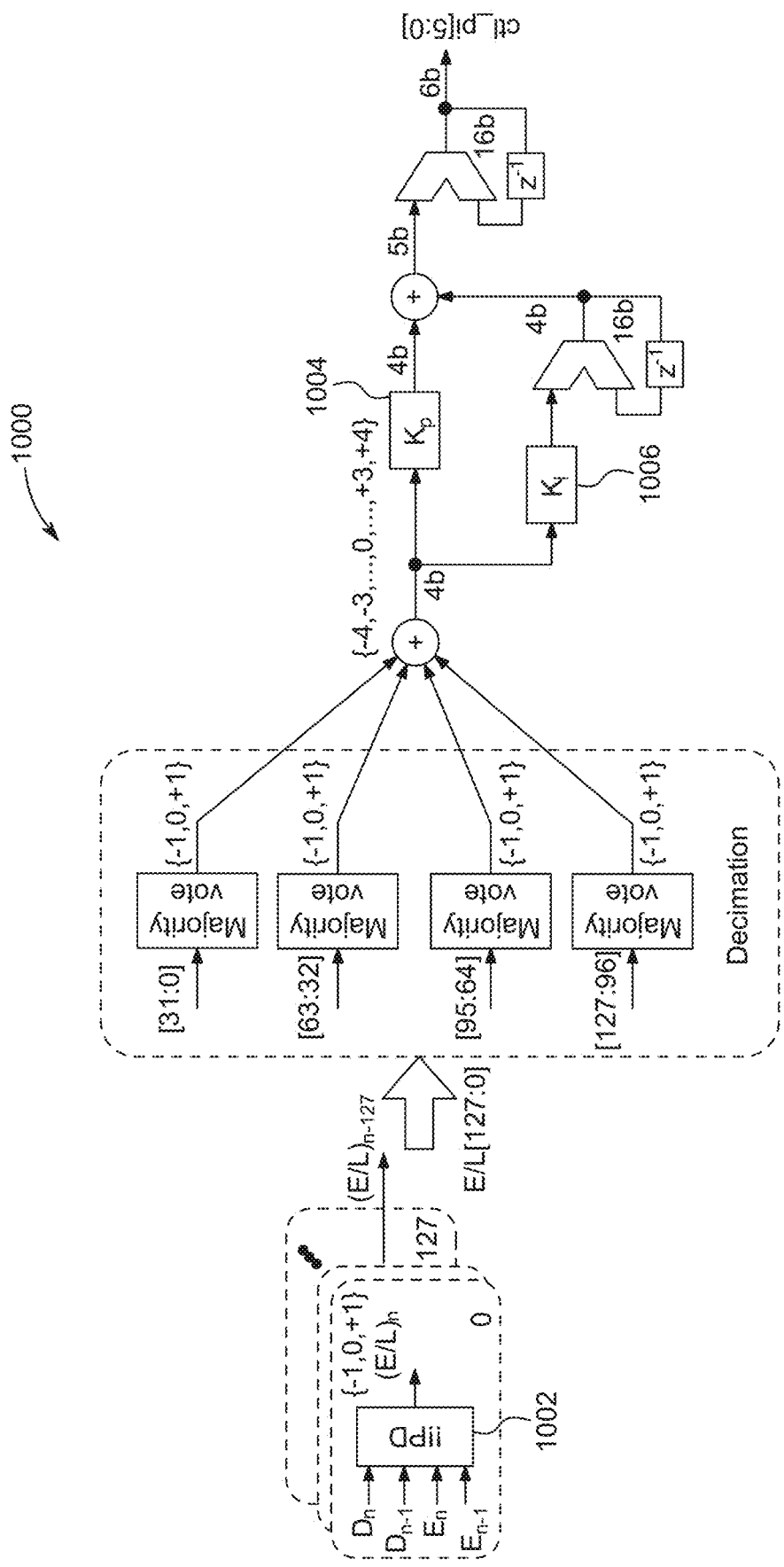
FIG. 10 is a block diagram depicting an exemplary full digital clock data recovery (CDR) with fixed bit resolutions, in accordance with an embodiment of the present disclosure.

FIG. 10 is a block diagram depicting an exemplary full digital clock data recovery (CDR) system 322 with fixed bit resolutions 1000, in accordance with an embodiment of the present disclosure. The CDR system 322 processes generated error and data signals in order to align a main sample clock with a data and maximize eye opening. The digital clock data recovery (CDR) implementation employs parallelization of the high-speed data-path in to one hundred and twenty eight low-speed parallel paths in digital. The digital CDR with fixed bit resolutions 1000 on the various processing paths is depicted. The resolution of these paths may be different for different implementations. A clock data recovery (CDR) loop comprises a phase detector (PD) 1002, a voter, a loop filter, and a PI 316 (effecting main sample clock). The phase detector (PD) 1002 turns error or data signals into early late votes and can be of various types. The phase detector (PD) 1002 implemented is a bang-bang (BB) type phase detector (PD) 1002, however, any other linear or non-linear implementation may be equally utilized. A decimator is employed for linearization of the BB-PD (this helps to reduce jitter on a recovered clock), and it can have various implementations. The digital CDR is based on a second-order loop which controls the PI 316. An integral path gain (KI) 1006 and a proportional path gain (KP) 1004 are optimized in a system to provide an optimum jitter performance and minimizing an acquisition and lock time for the CDR loop at the start-up of the link. In the case of the voter, a voting method utilized is a majority vote in which multiple phase detectors (PD) 1002 results are aggregated and the most common vote is the one passed forward to the loop filter. The present invention comprises multiple subgroups which are utilized, and the majority vote of each subgroup is summed to get a result passed into a loop filter. This increases the sensitivity of the loop and reduces the bang-bang jitter. The loop filter is a standard second order digital implementation with two inputs gain one for the proportional path another for the integral path, this loop filter may also be implemented as a first or higher order digital filter. The output of the loop filter is then integrated to give the PI code at an output.

Figure 11:
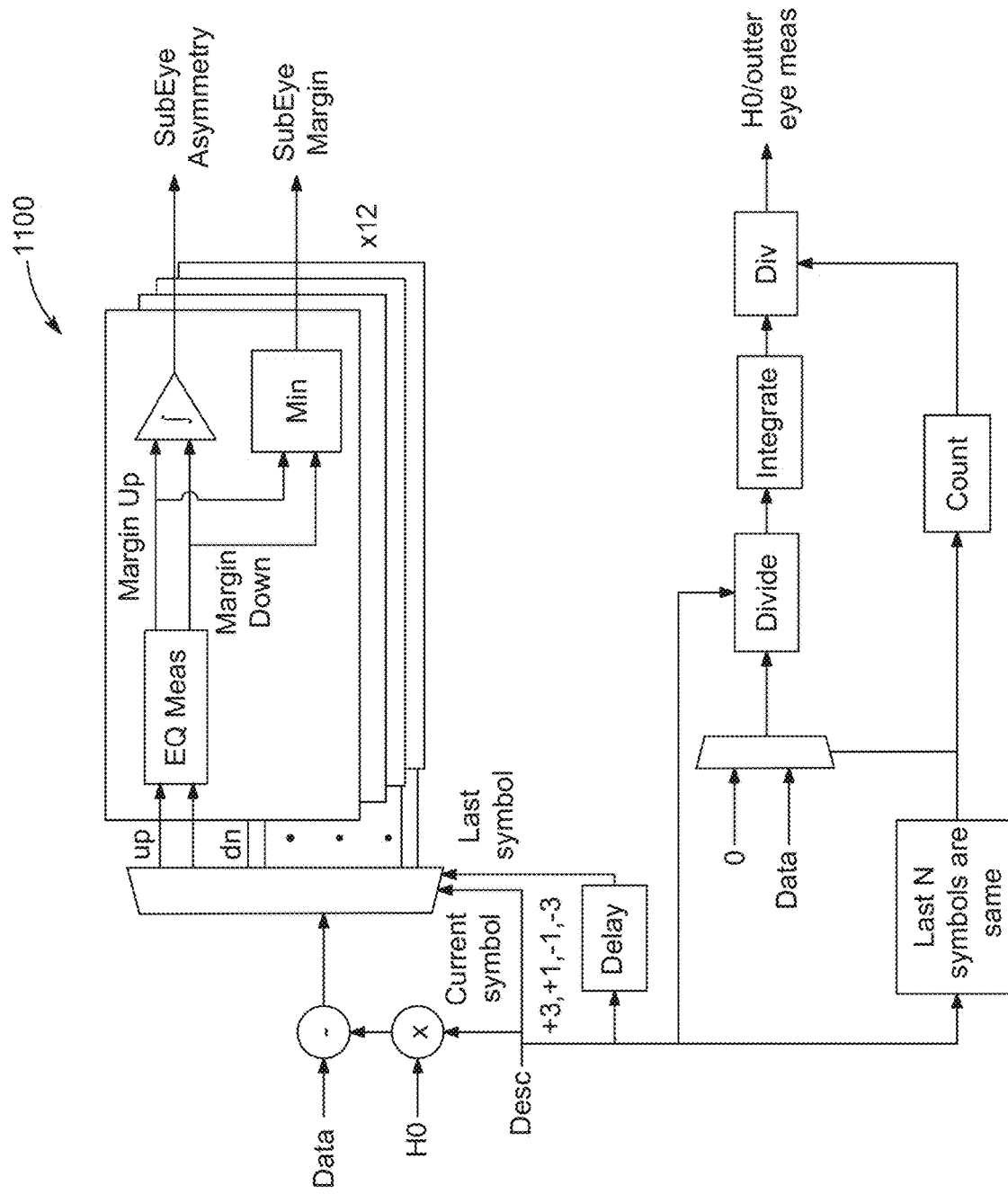
FIG. 11 is a block diagram depicting an exemplary eye quality measurement system, in accordance with an embodiment of the present disclosure.

FIG. 11 is a block diagram depicting an exemplary eye quality measurement system 324, in accordance with an embodiment of the present disclosure. In order to measure the eye quality, two measurements are required, one is the outer of an eye and another one is the inner of the eye. It is only run periodically to reduce power consumption as a signal-to-noise and interference ratio (SNAIR) of a link once adapted changes slowly over time.

In an embodiment, a tabular representation of a filtering data stream to margin data stream is depicted in Table. 2. The data stream may be split as defined in the following Table 2 two to find the up and down margin for the twelve sub-eyes.

TABLE 2

| Last Symbol | Current Symbol | Corresponding Sub-eye Up margin | Corresponding Sub-eye Down margin |
|---|---|---|---|
| +3 | +3 | +3 Top | N/A |
| +3 | +1 | +3 Mid | +3 Top |
| +3 | −1 | +3 Bottom | +3 Mid |
| +3 | −3 | N/A | +3 Bottom |
| +1 | +3 | +1 Top | N/A |
| +1 | +1 | +1 Mid | +3 Top |
| +1 | −1 | +1 Bottom | +1 Mid |
| +1 | −3 | N/A | +1 Bottom |
| −1 | +3 | −1 Top | N/A |
| −1 | +1 | −1 Mid | −1 Top |
| −1 | −1 | −1 Bottom | −1 Mid |
| −1 | −3 | N/A | −1 Bottom |
| −3 | +3 | −3 Top | N/A |
| −3 | +1 | −3 Mid | −3 Top |

TABLE 2-continued

| Last Symbol | Current Symbol | Corresponding Sub-eye Up margin | Corresponding Sub-eye Down margin |
|---|---|---|---|
| −3 | −1 | −3 Bottom | −3 Mid |
| −3 | −3 | N/A | −3 Bottom |

Figure 12:
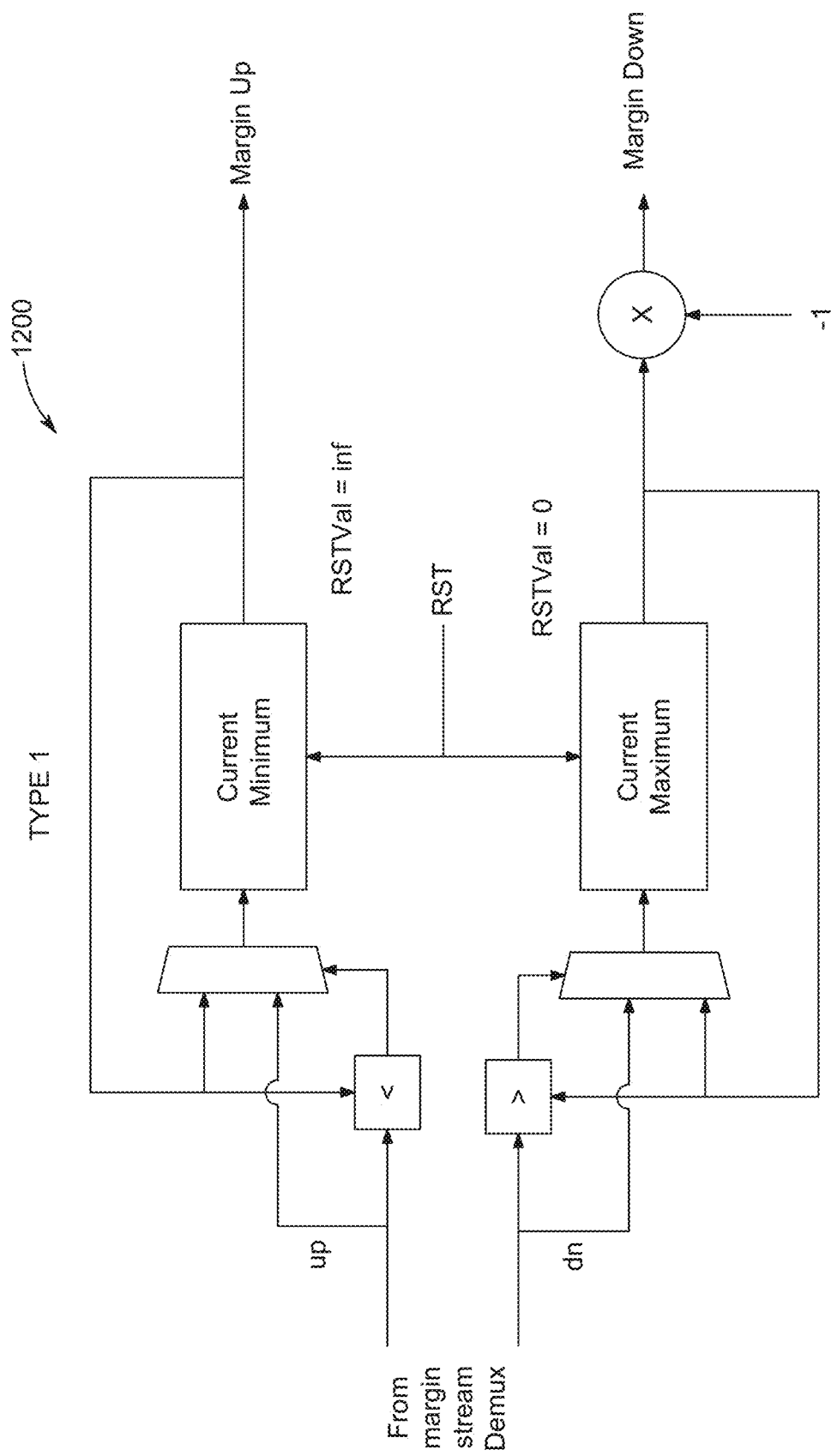
FIG. 12 is a block diagram depicting an exemplary type one eye quality measurer (EQ Meas), in accordance with an embodiment of the present disclosure.

FIG. 12 is a block diagram depicting an exemplary type one eye quality measurer (EQ Meas) 1200, in accordance with an embodiment of the present disclosure. The purpose of the eye quality measurer (EQ Meas) is to find an inner eye measurement for a given up or down input stream for a given sub-eye. There are twelve in total one for each sub-eye. The type one eye quality measurer (EQ Meas) 1200 is a less accurate and more susceptible to noise, however, has low complexity and power. The type one eye quality measurer (EQ Meas) 1200 looks for a minimum sample. A block is run for a programmable number of cycles (Nbits seq). If the block is run for three thousand samples, then, the result is a 1e-3 margin with a confidence level of ninety five percent. The type one eye quality measurer (EQ Meas) 1200 is utilized for testing if there is any eye opening and other low accuracy requirement tests.

Figure 13:
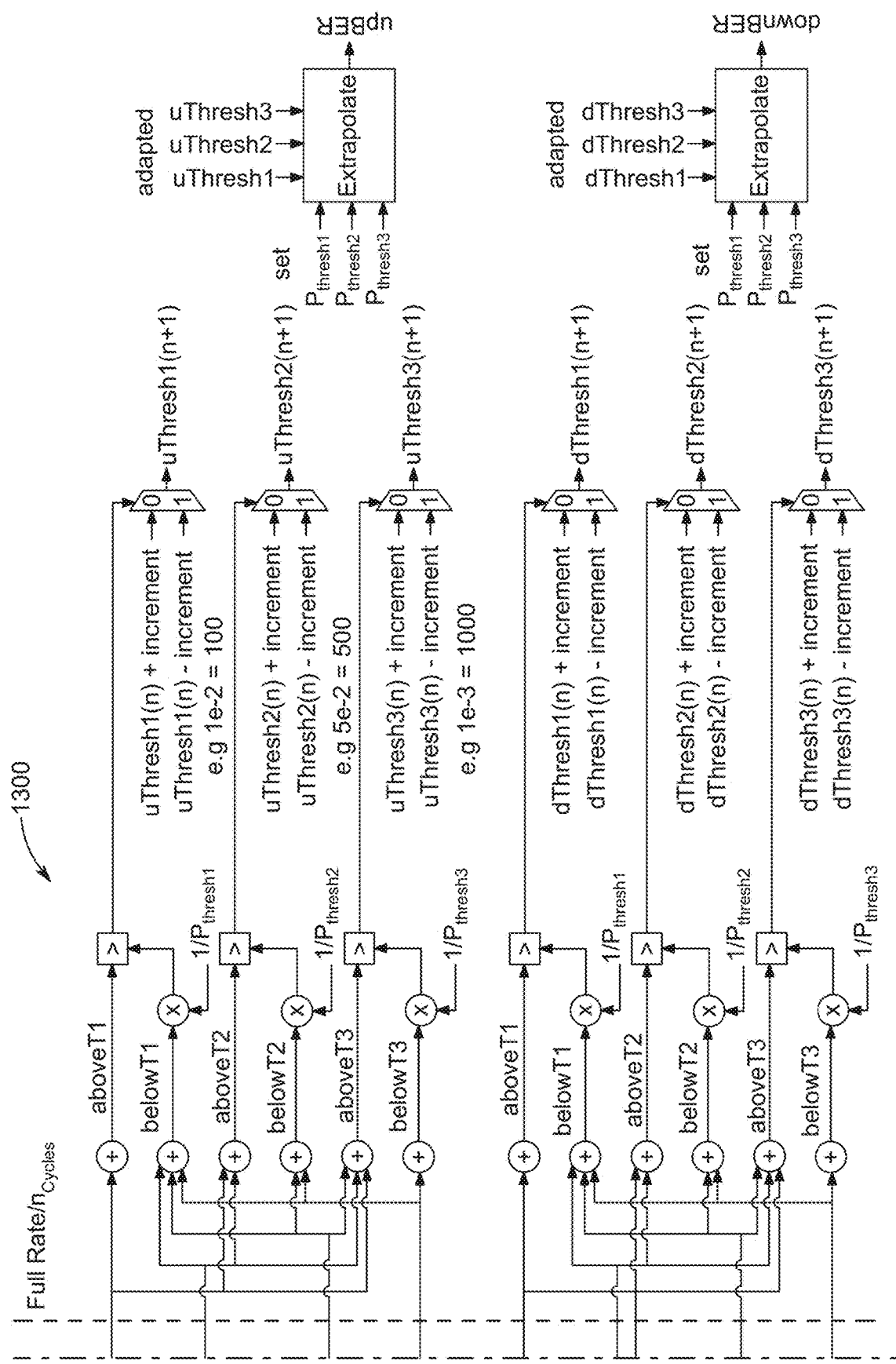
FIG. 13 is a block diagram depicting type two eye quality measurer (EQ Meas), in accordance with an embodiment of the present disclosure.
Figure 13:
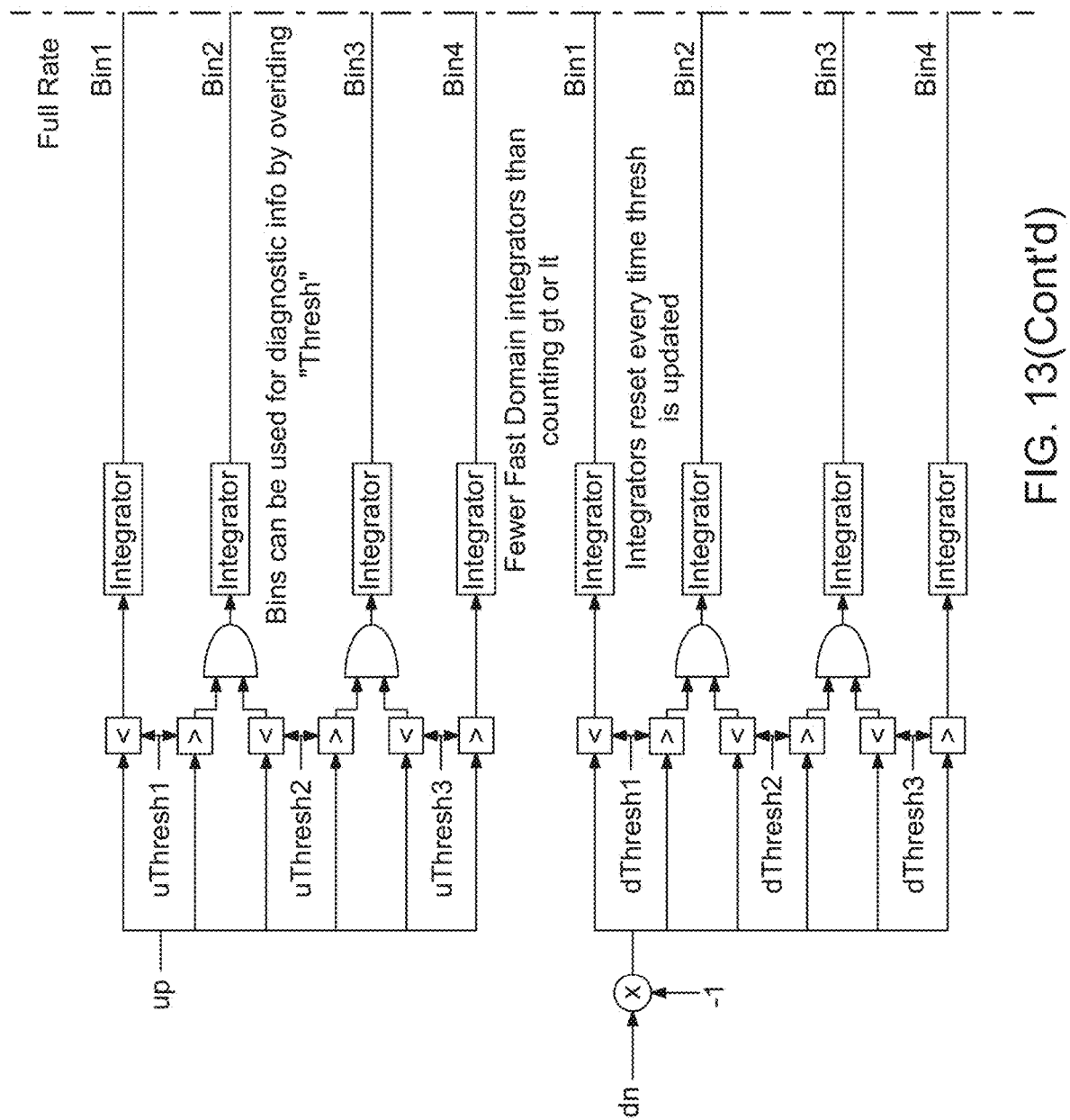

FIG. 13 is a block diagram depicting type two eye quality measurer (EQ Meas) 1300, in accordance with an embodiment of the present disclosure. The type two eye quality measurer (EQ Meas) 1300 is more complex and requires more calculation. However, this is more accurate and has programmable thresholds and target margins. The type two eye quality measurer (EQ Meas) 1300 utilizes a low bin count histogram and programmable BER thresholds to adapt histogram bin thresholds until the ratio of the above * (where *=threshold 1/2/3) and below* are in the same ratio as the corresponding programmable bit error rate (BER) thresholds. For example, if a desired margin to find is 1e-3, then the ratio of counts above the threshold should be one thousand times the counts below a threshold. In this example, three probabilities (nThresh) are searched. However, it is scalable to any number of levels. The type two eye quality measurer (EQ Meas) 1300 comprises a fast section and a slow section. The fast section consists of a full rate histogram counter to find the counts above and below certain thresholds. The slow section comprises a summation of a bis to recover a greater than and less than counts and logic to adapt the thresholds to align them to the programmable BER thresholds. Once the adapted thresholds have settled, then the probabilities and corresponding thresholds may be extrapolated to find the BER at the sample point. This is performed for both up and down margins. The type two eye quality measurer (EQ Meas) 1300 may be performed at full rate with nThresh*2 integrators (one each for up and down) and a dedicated slow section for each up and down. The type two eye quality measurer (EQ Meas) 1300 is utilized when a precise margin estimation is needed for a given probability.

In an embodiment, in the case of use of the eye quality measurement system 324, it is inferred that, once the margins and outer eye measurements are known, this information may be utilized in a variety of ways to optimize a power to performance ratio of the AFE. This allows the SNAIR aware ADC based receiver 300 to utilize only as much power as it needs to recover the data and not more. In the case of eye centering, to center the eye, $h_1$ is modified by looking at the majority vote of the twelve sub-eye asymmetry signals. This ensures that the eye is centered as optimally as possible for all the twelve sub-eyes. In the case of analog front end (AFE) optimization, in a SNAIR aware ADC based receiver 300 it is possible to set the AFE performance such that it is performing just below the target BER at all times. For example, a low loss channel which inherently has higher signal-to-noise and interference ratio (SNAIR) may consume considerably less power in and the SNAIR aware ADC based receiver 300 compared to a standard receiver. In the case of analog front end (AFE) linearity, by examining the asymmetry data from the eye quality measurement system 324 it is possible to determine if the signal at the input of the ADC 402 is suffering from non-linearity. The non-linearity is undesirable as this causes performance of FFE 500 to suffer. The linearity may be improved either by reducing the signal swing or by use of a linearity compensation block.

In another embodiment, in the case of the digital control 326, the SNAIR aware ADC based receiver 300 utilizes the following startup procedure: a pre-adaption, a clock data recovery (CDR) lock, a tap adaption, a $h_1$ centering, an analog front end (AFE) tuning and the like. In the case of the pre-adaptation, baud rate systems require certain criteria to be met for stable locking. The purpose of the pre-adaptation is to have the eye in a suitable state for the CDR lock. This state does not require the final bit error rate (BER) needed for link operation and is only enough of a conforming eye in order to achieve the CDR lock and enable further steps. The first part of pre-adaption is to calibrate the ADC 402 for gain and offset and other initial calibrations which can be performed without the CDR lock. The second part of pre-adaption is to adapt the CTLE 308 and a VGA 310 to increase the ability of the CDR system 322 to lock. To perform this, a rough breakdown of the power vs frequency is needed. To perform this, a band power measurement block is utilized. Once the power versus frequency is known, the CTLE 308 may be adapted until the power in each band is at a target ratio, nominally equal. This implies the SNAIR aware ADC based receiver 300 is roughly equalized.

Figure 14:
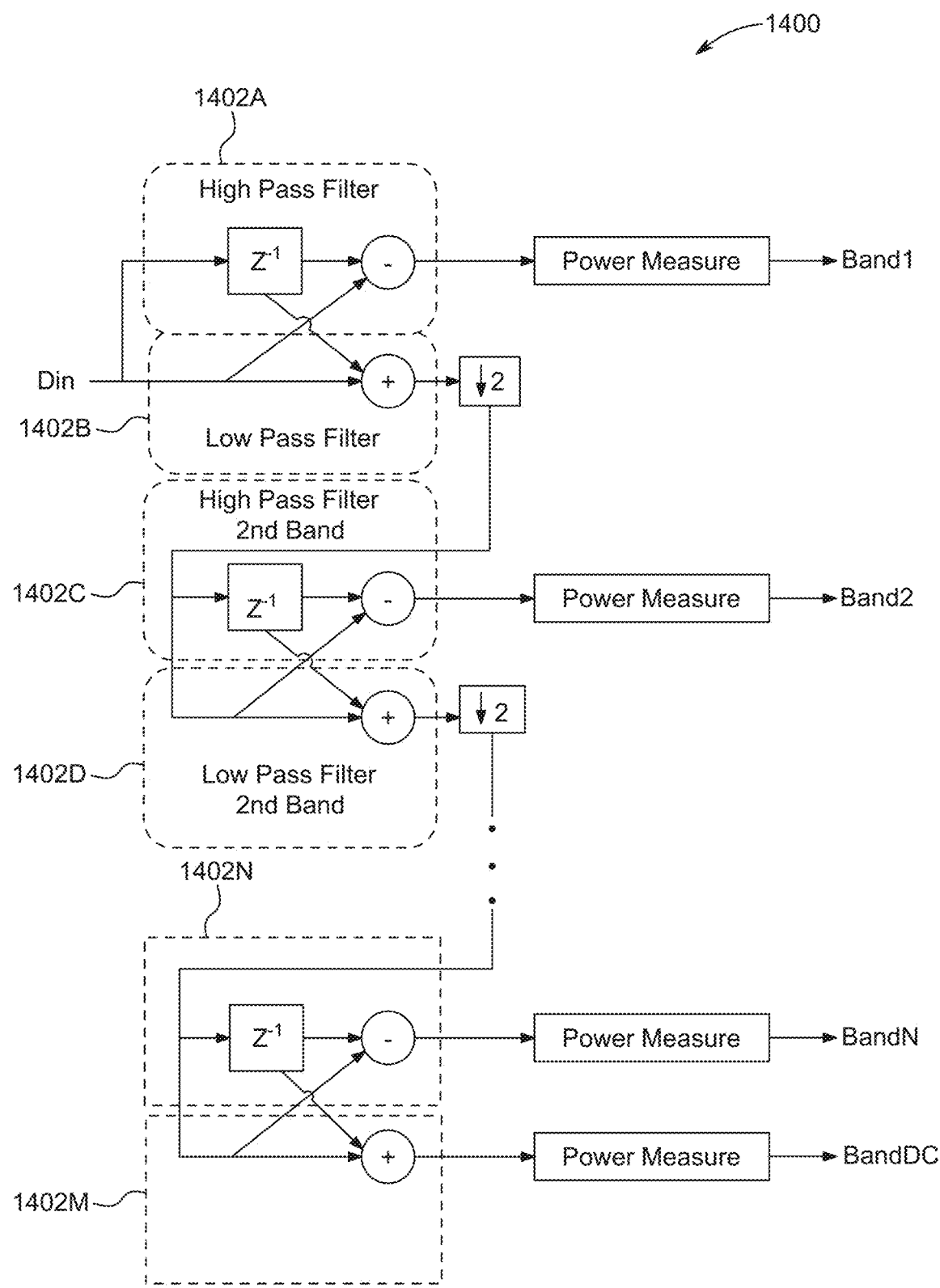
FIG. 14 is a block diagram depicting an exemplary band power measurement system, in accordance with an embodiment of the present disclosure.
Figure 15A:
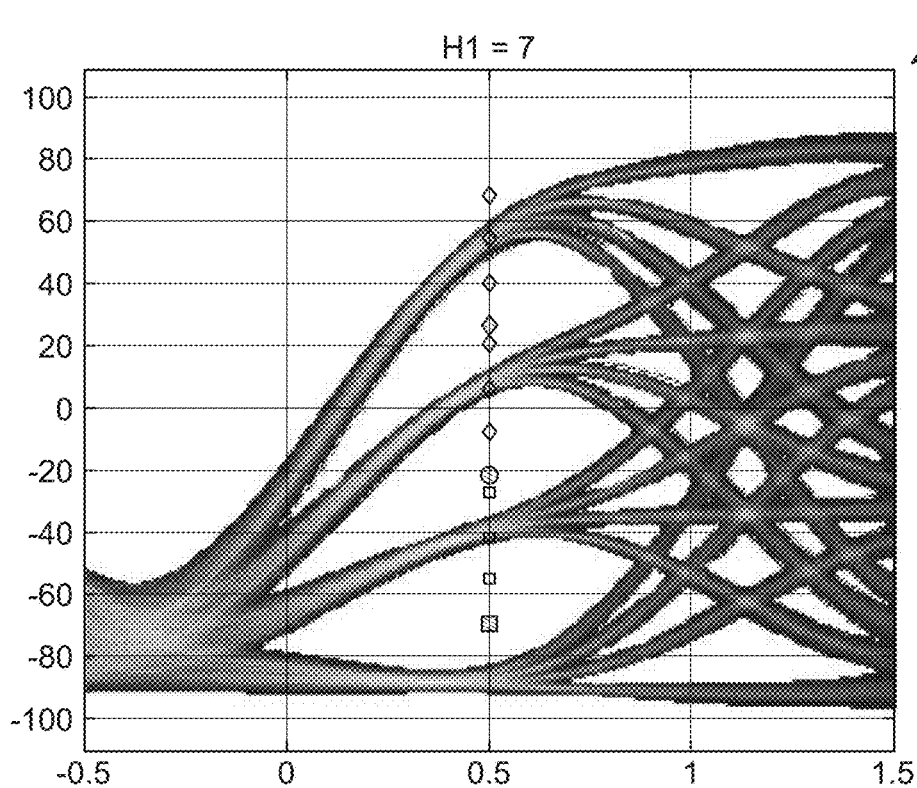
FIG. 15A-D is a graphical representation depicting an exemplary $h_1$ effect on sampling position, when $h_1=7$, in accordance with an embodiment of the present disclosure.
Figure 15B:
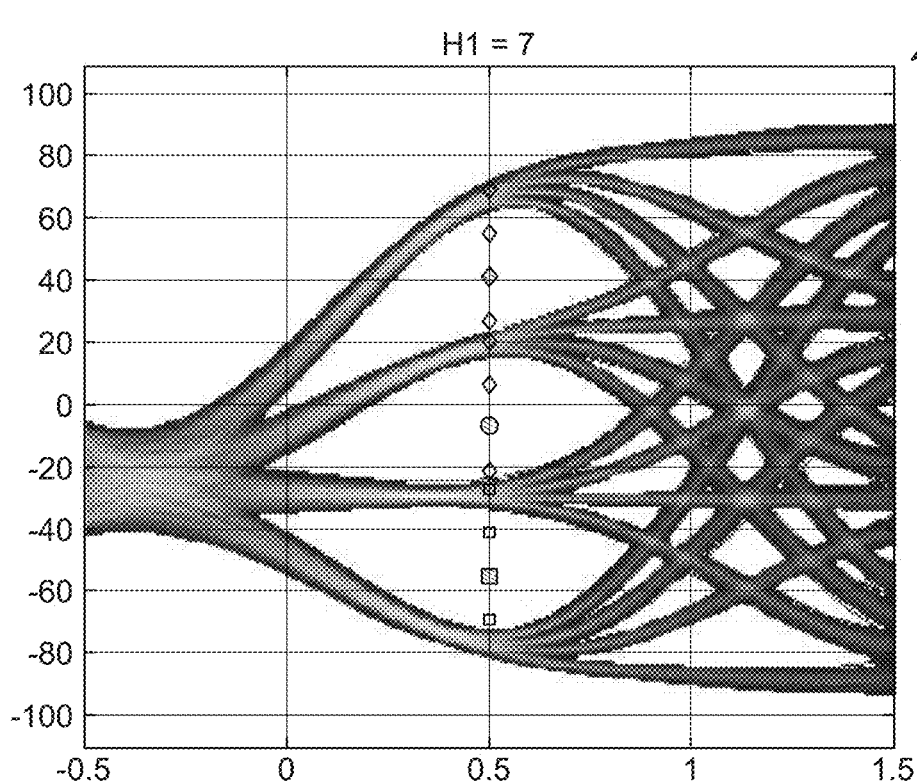
Figure 15C:
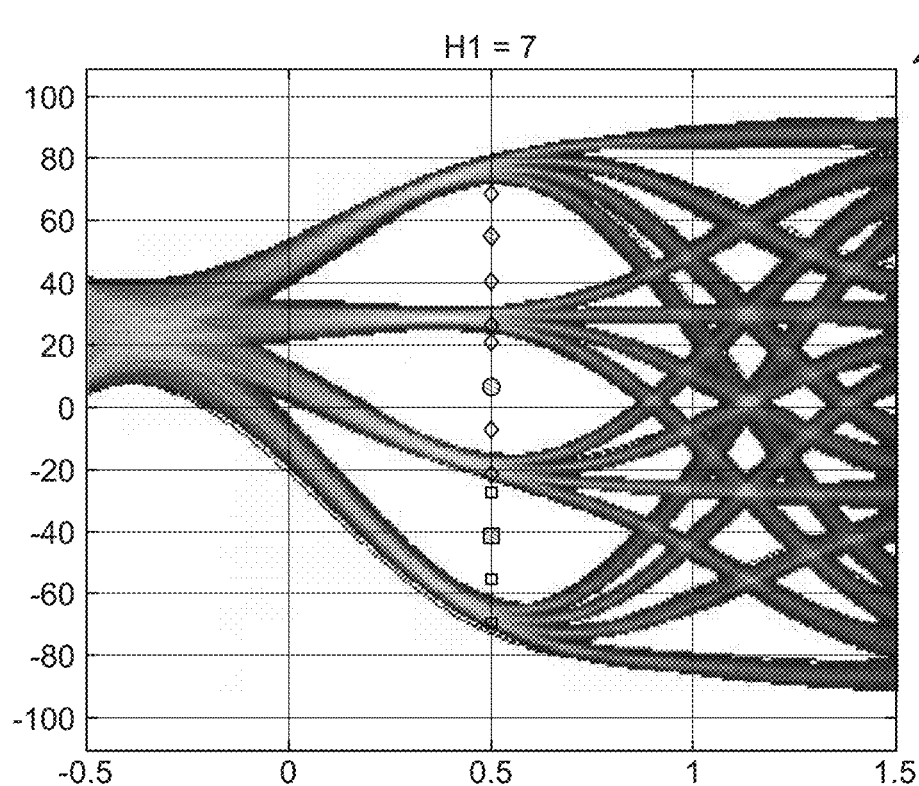
Figure 15D:
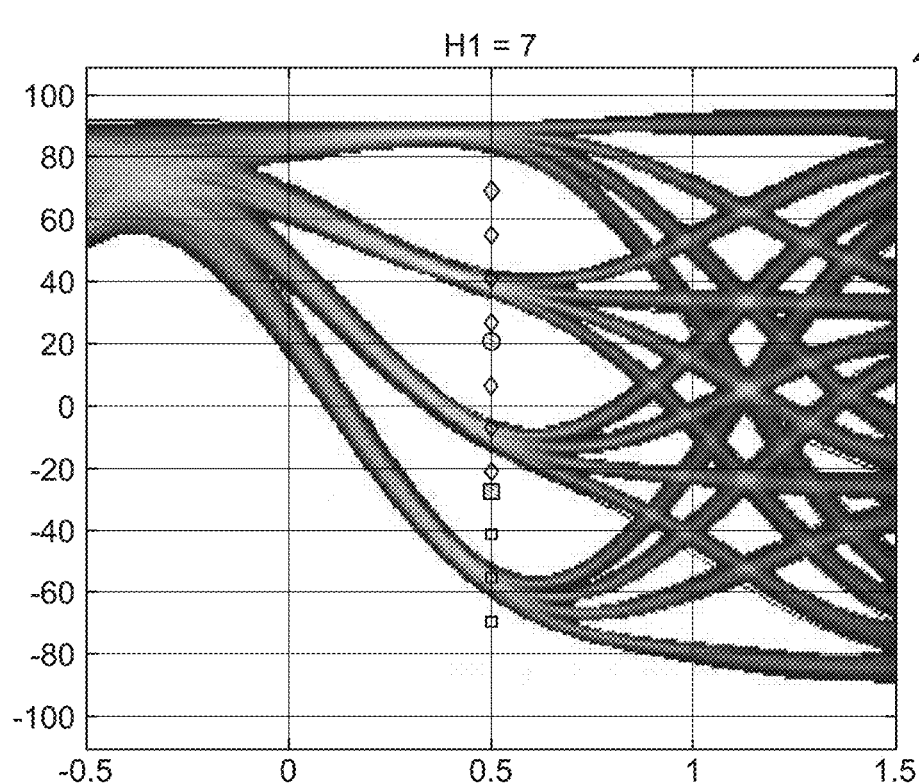
Figure 16A:
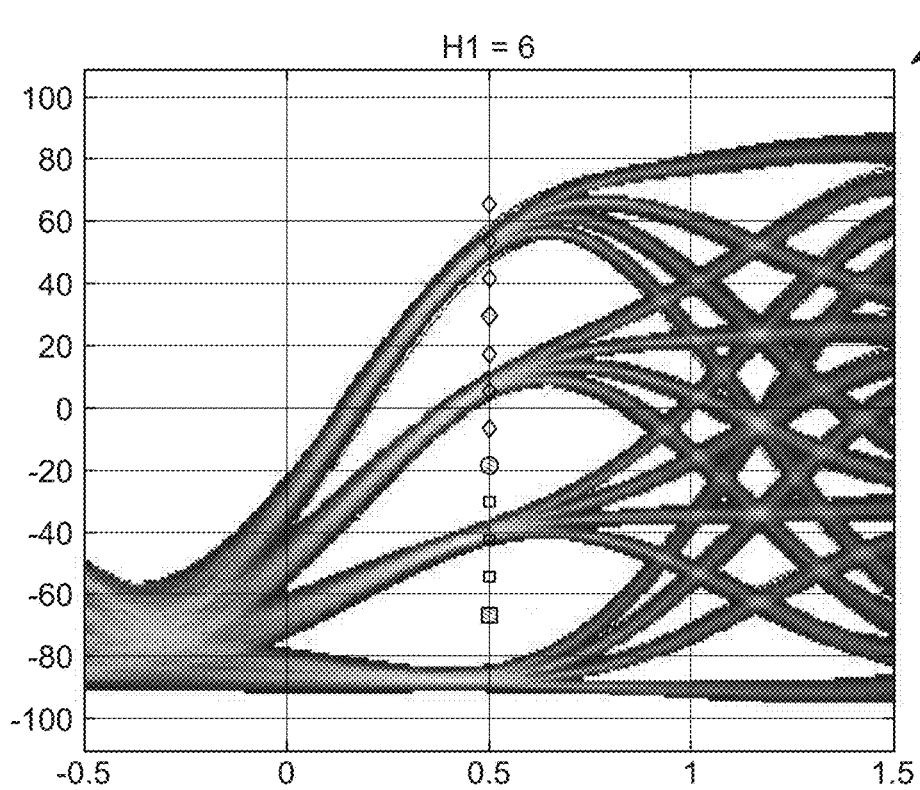
FIG. 16A-D is a graphical representation depicting an exemplary $h_1$ effect on sampling position, when $h_1=6$, in accordance with an embodiment of the present disclosure.
Figure 16B:
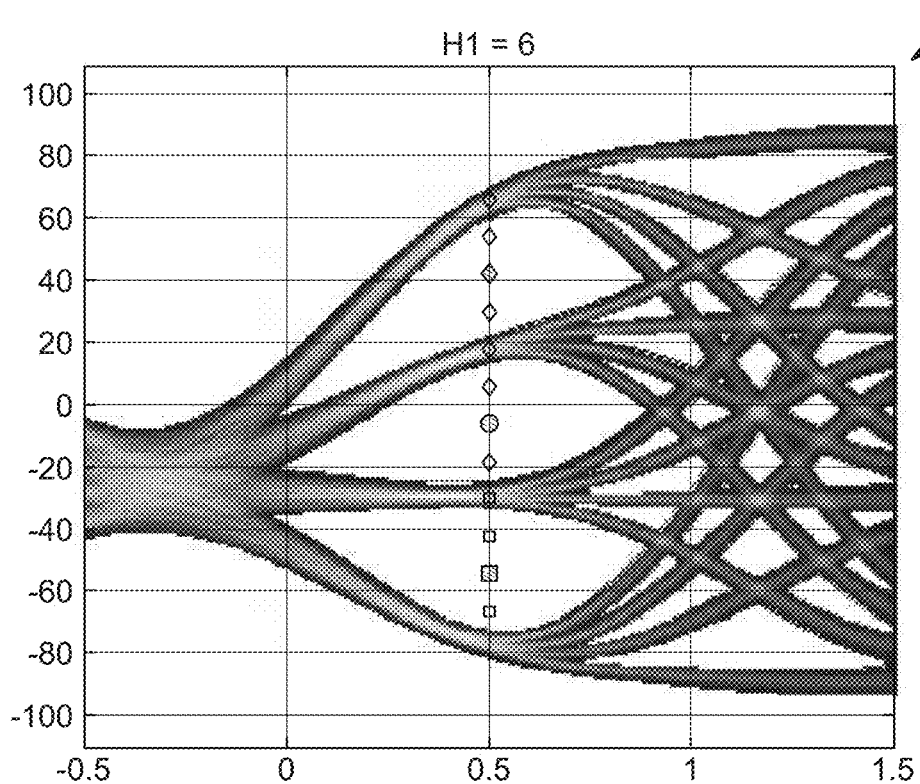
Figure 16C:
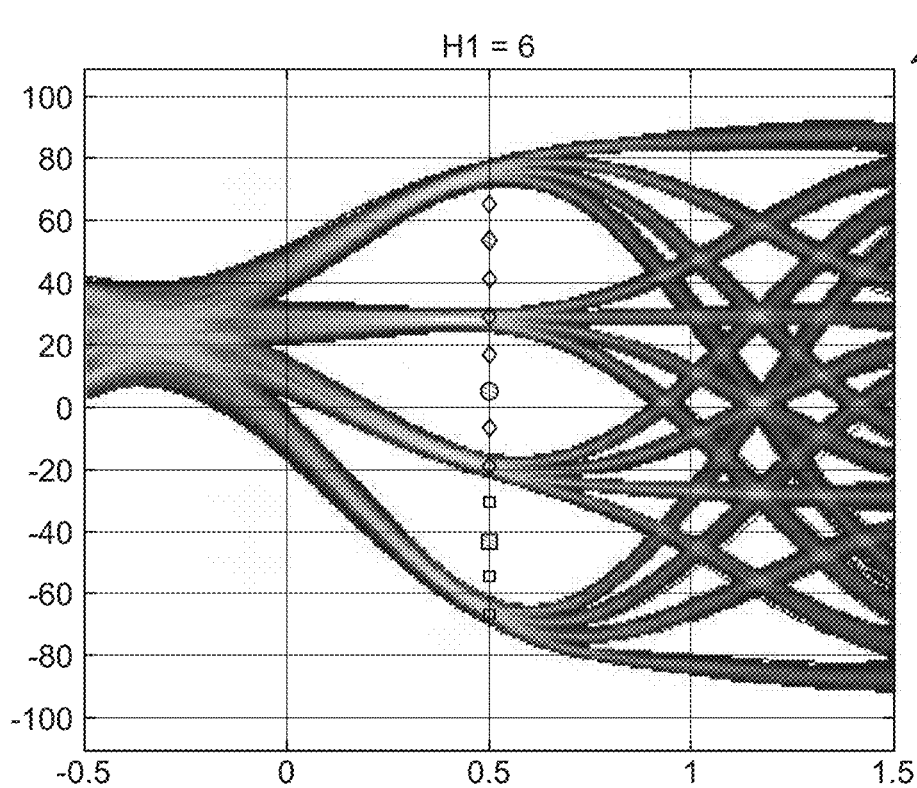
Figure 16D:
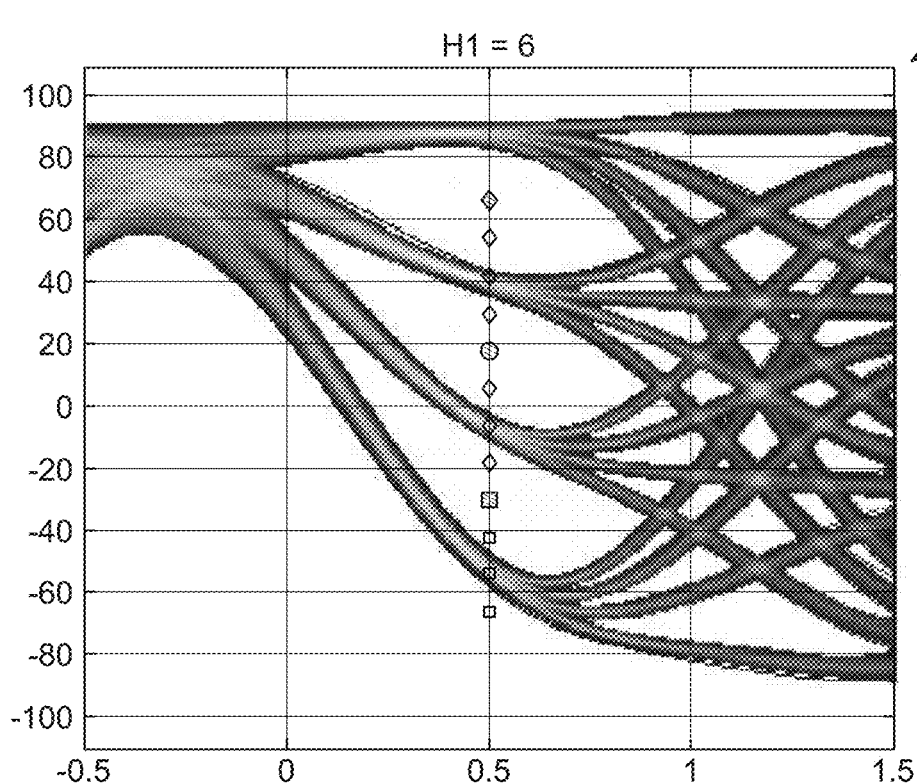
Figure 17A:
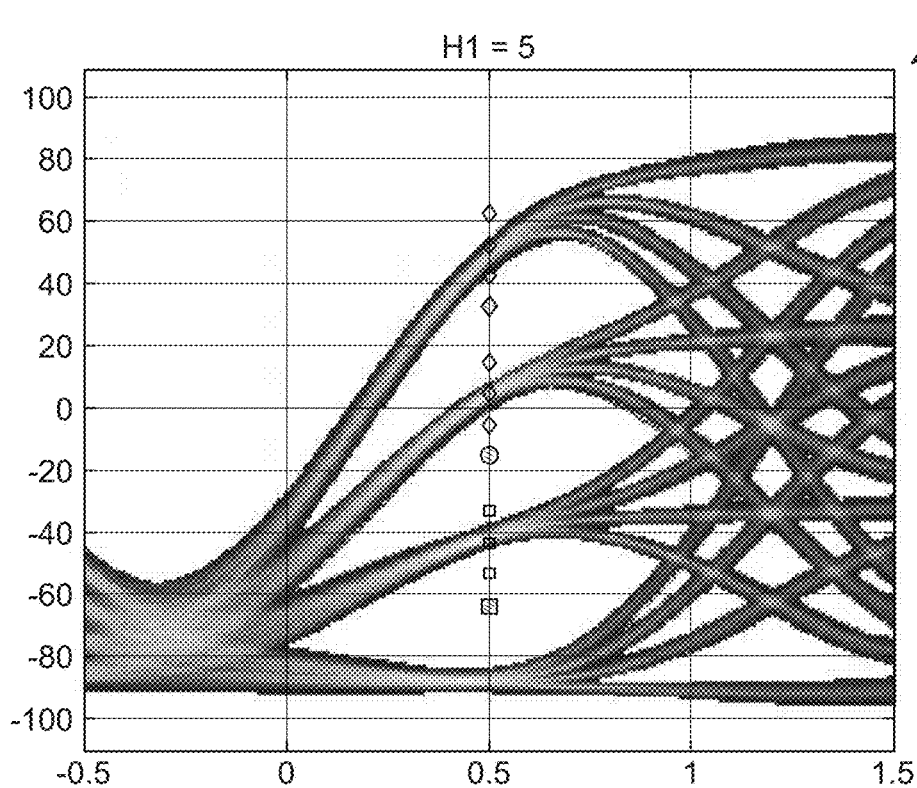
FIG. 17A-D is a graphical representation depicting an exemplary $h_1$ effect on sampling position, when $h_1=5$, in accordance with an embodiment of the present disclosure.
Figure 17B:
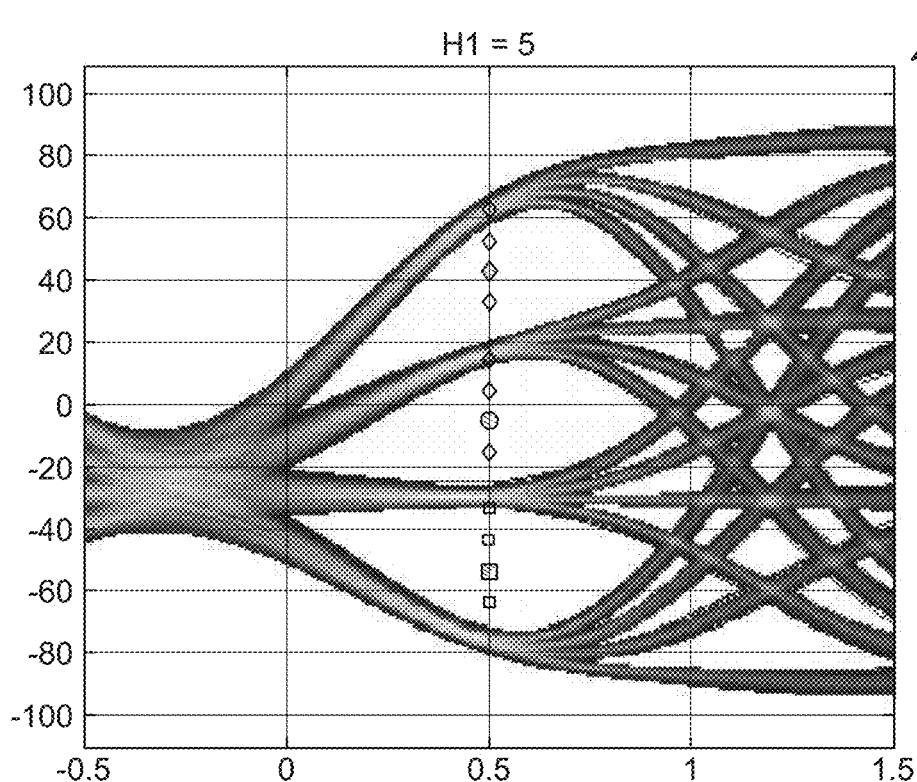
Figure 17C:
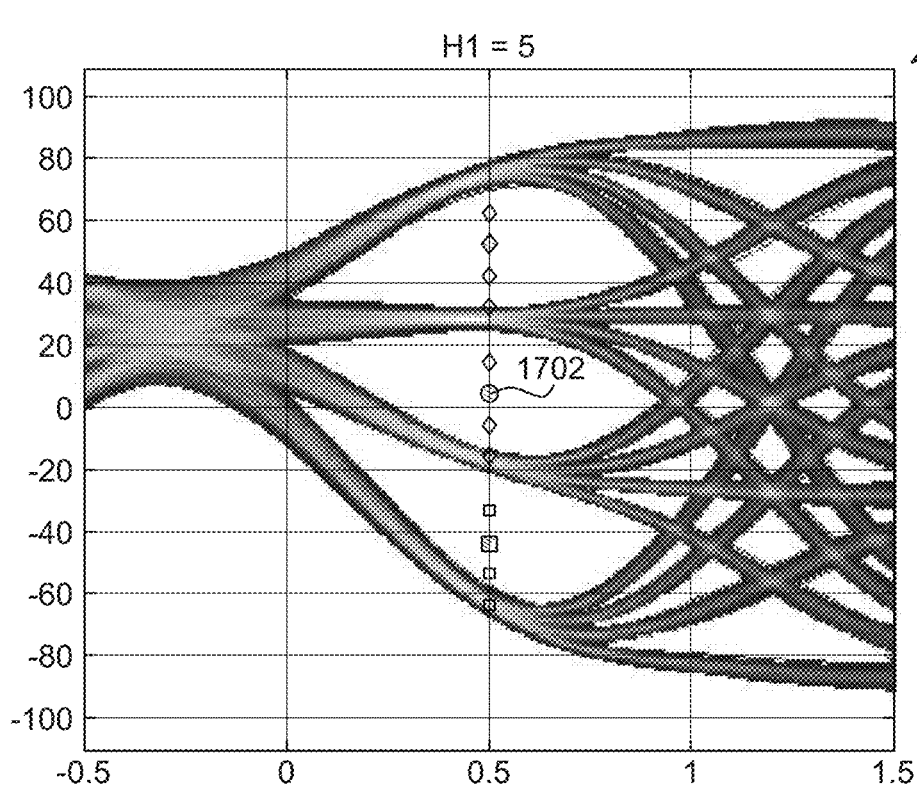
Figure 17D:
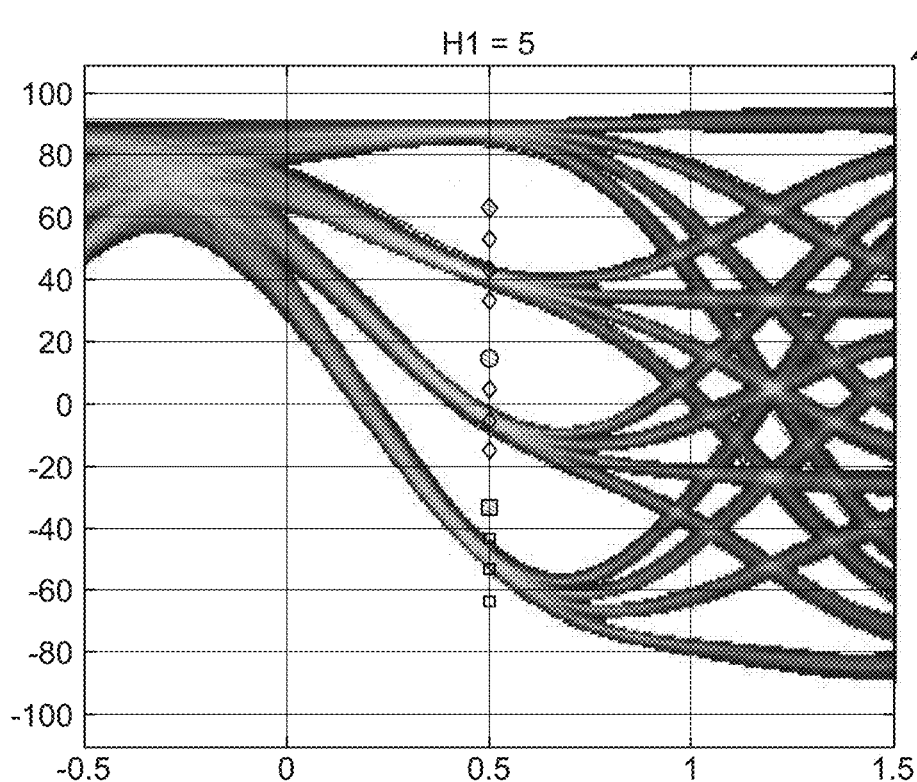

FIG. 14 is a block diagram depicting an exemplary band power measurement system 1400, in accordance with an embodiment of the present disclosure. In this band power measurement system 1400, an incoming signal is filtered with a digital high pass filter 1402A and a low pass filter 1402B. These filters are exemplary and may be replaced with any variation of high and low pass digital filters. High pass filter output is fed into a power measurement block and gives the power from Fnyquist/2 to Fnyquist (where Fnyquist=half of the sample rate or symbol rate of the system). Low pass filter output is decimated by a factor of 2 and again filtered. The second high pass filter 1402C output is measured, and that power in the second band power which is Fnyquist/4 to Fnyquist/2. The second low pass filter 1402D output result is fed onto the next band. This is repeated for as many bands as necessary with the final high pass filter 1402N is the Fnyquist/$2^{(n-1)}$ to Fnyquist/$2^n$ and the final low pass filter 1402M is a DC band power.

In another embodiment, in the case of a clock data recovery (CDR) lock, at this point the clock data recovery (CDR) system 322 is engaged and allowed to lock. The lock checking may be achieved through conventional means and utilizing type one eye quality measurer (EQMeas) 1200 to check if there is any eye opening. If there is no eye opening, the clock data recovery (CDR) lock is re-attempted with slightly different initial conditions. During the clock data recovery (CDR) lock, the acquisition range is increased by utilizing a higher (1st order) path gain (Kprop) value. The Kprop value is reduced once the clock data recovery (CDR) system 332 has achieved lock to reduce jitter.

In another embodiment, in the case of tap adaption, for least mean square (LMS), in order to adapt the FFE Htap values, the error stream is correlated with the delayed data stream. In an ideally equalized channel, as the data is random, there should be no correlation between the two signals. The correlated value is utilized to update the tap value with some gain factor to remove instability ($<<$1). By driving the corresponding correlation value to zero the Htap value is cancelled.

SSLMS

Input: $d_{n-k}$; $e_n$

Output: $h_k$; k=$N_{FFEPre}$, . . . , −2, −1, 2, 3, . . . , $N_{FFEPost}$ $$hk(n)=hk(n-1)+w(k)\cdot\text{sgn}(d(n-k))\cdot\text{sgn}(e(n)); \; w(k)<0.1 \quad \text{equation}(2)$$

This may be performed as a full product correlation (accurate and expensive) or as a sign only (less accurate but more implementable). To decrease the amount of time needed to adapt the taps, a two-gear approach is utilized. First gear has a higher $w_k$ in order to allow rough and approximate convergence in a short time frame. The second gear has a much lower $w_k$ in order to be stable and achieve high resolution.

FIG. 15A-D is a graphical representation depicting an exemplary $h_1$ effect 1500A-D on sampling position, when $h_1$=7, in accordance with an embodiment of the present disclosure.

FIG. 16A-D is a graphical representation depicting an exemplary $h_1$ effect 1600A-D on sampling position, when $h_1$=6, in accordance with an embodiment of the present disclosure.

FIG. 17A-D is a graphical representation depicting an exemplary $h_1$ effect 1700A-D on sampling position, when $h_1$=5, in accordance with an embodiment of the present disclosure. In the case of $h_1$ centering, as a CDR system 322 minimizes the error signal, by changing $h_1$ the CDR lock point is moved (as depicted in 1702 in the below diagrams) left and right.

Figure 18A:
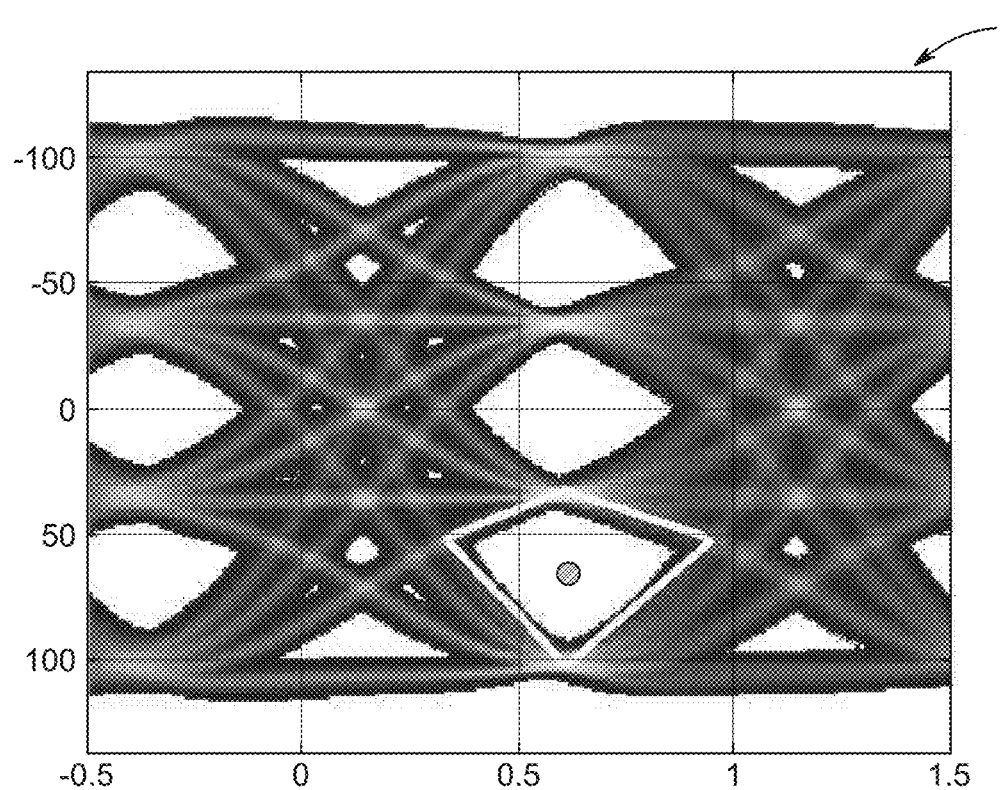
FIG. 18A-B is a graphical representation depicting an exemplary sub-eye sampling position, in accordance with an embodiment of the present disclosure.
Figure 18B:
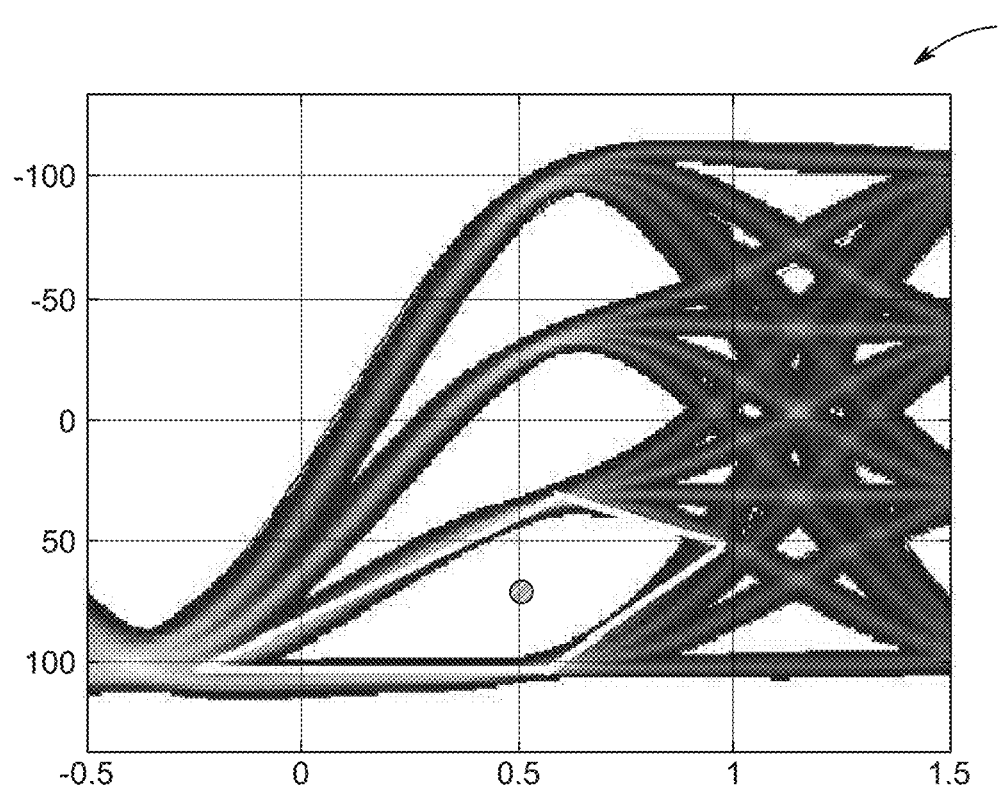

FIG. 18A-B is a graphical representation 1800A-B depicting an exemplary sub-eye sampling position, in accordance with an embodiment of the present disclosure. In the case of sub-eye sampling position, in an unrolled system 1800B the optimum sampling position of the eye is different from a conventional (non-unrolled) system 1800A. This is due to the fact that the previous decision is known. As an example, take the −3→3 trace, in a conventional (non-unrolled) system, the limiting trace for the bottom eye is the +3→−3 and the −3→+3 which have gradients of −3 and 3 respectively. In an unrolled system, the −3 bottom eye is limited by the −3→−1 and the −3→3 on traces which have gradients of 1 and 3 respectively. The shallower left limiting trace gradient means that there is more horizontal opening available to the unrolled sub-eye than the conventional bottom sub-eye. This means the ideal sampling position may be more left.

In an embodiment, in the case of eye centering, to center the eye $h_1$ is modified by looking at the majority vote of the twelve sub-eye asymmetry signals. This ensures that the eye is centered as optimally as possible for all twelve sub-eyes. In the case of AFE tuning, after eye centering the AFE, is tuned more finely to optimize the SNAIR. The CTLE 308 is controlled by trying to minimize the sum of the values utilized in a FFE 500. In conventional systems, the AFE is optimized to set the outer eye to a target value (nominally constrained by the design), the target BER is then guaranteed by design. This is inefficient as it consumes more power than needed and gives a lower BER than is necessary for link operation. In the SNAIR aware ADC based receiver 300, it is possible to set the AFE performance such that it is always performing at or only just below the target bit error rate. This means for example a low loss channel which inherently has higher SNAIR may consume considerably less power in and the SNAIR aware ADC based receiver 300 compared to a standard receiver.

Figure 19:
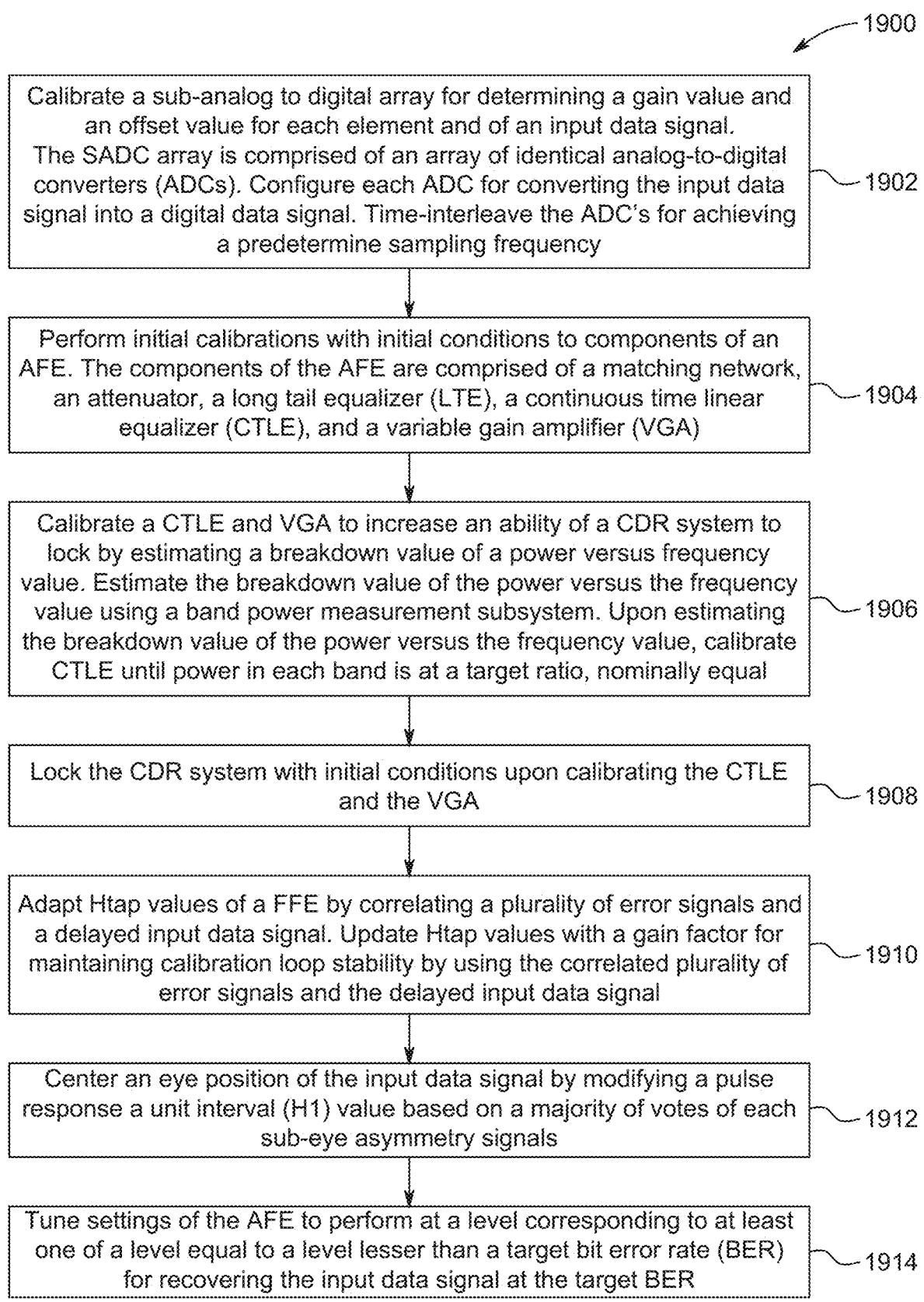
FIG. 19 is a flow chart depicting a method for recovery of a signal transmitted over a channel using a signal to noise and interference ratio (SNAIR) aware analog to digital converter (ADC)-based-receiver, in accordance with an embodiment of the present disclosure.

FIG. 19 is a flow chart depicting a method 1900 for recovery of a signal transmitted over a channel using a signal to noise and interference ratio (SNAIR) aware-analog to digital converter (ADC)-based-receiver 300, in accordance with an embodiment of the present disclosure. At step 1902, a sub-analog-to-digital converter (SADC) array 314 is calibrated for determining a gain value and an offset value for each element and also of an input data signal. The SADC array 314 is comprised of an array of identical ADCs 402. Each ADC 402 is configured for converting the input data signal into a digital data signal. The ADCs 402 are time-interleaved for achieving a predetermined sampling frequency.

At step 1904, the initial calibrations with initial conditions are performed to components of the AFE. The components of the AFE are comprised of a matching network (MN) 302, an ATTN 304, an LTE 306, a CTLE 308, and a VGA 310.

At step 1906, the CTLE 308 and the VGA 310 are calibrated to increase the ability of the CDR system 322 to lock by estimating a breakdown value of a power versus frequency value. The breakdown value of the power versus the frequency value is estimated using a band power measurement subsystem. Upon estimating the breakdown value of the power versus the frequency value, the CTLE 308 is calibrated until power in each band is at a target ratio, nominally equal.

At step 1908, the CDR system 322 is locked with initial conditions upon calibrating the CTLE 308 and the VGA 310.

At step 1910, the Htap values of the FFE 500 are adapted by correlating a plurality of error signals and a delayed input data signal. The Htap values are updated with a gain factor for maintaining calibration loop stability by using the correlated plurality of error signals and the delayed input data signal.

At step 1912, the eye position of the input data signal is centered by modifying a pulse response at a unit interval ($h_1$) value based on a majority of votes of each sub-eye asymmetry signals.

At step 1914, the settings of the analog front end (AFE) are tuned to perform at a level corresponding to at least one of a level equal to a level lesser than a target bit error rate (BER) for recovering the input data signal at the target bit error rate (BER). Lower BER is refers to fewer errors in a sequence.

The method 1900 further comprises locking the CDR system 322 with initial conditions upon calibrating the CTLE 308 and the VGA 310.

The method 1900 further comprises increasing the acquisition range of the clock data recovery (CDR) during the CDR lock operation using a higher CDR proportional (1st order) path gain (Kprop) value, while maintaining the clock data recovery (CDR) loop stability. The method 2100 further comprises monitoring a signal-to-noise and interference ratio (SNAIR) during operation and adapting to a predetermined signal-to-noise and interference ratio (SNAIR) target value for adapting across process, voltage, and temperature (PVT) variations. The method 1900 further comprises centering the eye position of the input data signal which comprises centering the eye position by adjusting the $h_1$ value based on a majority vote of the eye asymmetry signals.

In an embodiment, the present invention has the following advantages. By keeping the bit error rate (BER) closer to the maximum target, the signal-to-noise and interference ratio (SNAIR) aware receiver 300 optimizes the analog front end (AFE) power needed to recover the signal to the least needed. By employing analog-to-digital converter (ADC)-based architecture, several powerful digital signal processing (DSP) algorithms may be implemented in digital circuitry, which leads to an optimum clock data recovery (CDR) controlling loop and baud rate-clock data recovery (BR-CDR) which can be deployed efficiently. By using a baud rate system, the sampling frequency of the ADC 402 is halved as compared to double data rate (DDR) systems which substantially reduces the power over conventional systems. By guaranteeing the signal-to-noise and interference ratio (SNAIR) at the input of the sampler 312, the ADCs 402 resolution requirements (ENOB) are reduced which save power and area. The present invention enables fifty percent power reduction of the receiver in comparison to state-of-the-art wireline receivers or receivers in SerDes. The present invention allows the receiver to adapt optimally across process, voltage, and temperature (PVT) variation in silicon by constantly monitoring the signal-to-noise and interference ratio (SNAIR) in the background during operation and adapting to a constant signal-to-noise and interference ratio (SNAIR) target, hence always ensuring the same bit error rate (BER). The present invention allows the receiver to provide optimal energy efficiency (that is lowest picojoule per bit) for a given channel loss by adapting the receiver's analog front end (AFE) to the optimal value (that is not amplify and equalize the signal more than it has to in order to recover the signal) to recover the signal for the target bit error rate (BER). The present invention reduces the area of the receiver by >30% as the system is a baud-rate system which runs at half the clock rate or sampling rate in comparison to state of the art systems, hence requiring half the number time-interleaved ADCs to implement the system. The present invention is a signal to noise and interference ratio (SNAIR) aware analog to digital converter (ADC) based receiver which provides a great reconfigurability for different communication protocols and the receiver can automatically adapt itself to any channel-loss ranging from 0 dB-40 dB without needing to change the hardware. The present invention adapts and scales the signal swing via the analog front end (AFE) to achieve the desired signal-to-noise and interference ratio (SNAIR) for a given target bit error rate (BER) using minimal analog front end (AFE) power. Signal-to-noise and interference ratio (SNAIR) awareness helps to relax the required effective number of bits (ENOB) in ADC 402. Hence, ADC 402 can employ a compact and power efficient architecture. By providing a multi-bit decision to digital, the present invention empowers digital circuitry to employ sophisticated digital signal processing (DSP) algorithms such as FFE 500, decision feedback equalization (DFB) 600, linearity calibration, the CDR system 322 with a high power-efficiency, therefore, improving the power consumption and improving the system performance Indeed, the key element for power-saving in ADC-based receiver approach is to use an optimum ADC ENOB for the target bit-error rate (BER). This is governed by signal-to-noise and interference ratio (SNAIR) awareness of the system, which is explained above. In the proposed analog-to-digital converter (ADC) based receiver, thanks to the smart digital signal processing (DSP) based algorithms, employ the baud rate-clock data recovery (BR-CDR) technique and reduce the power consumption largely (~50% in ADC) whilst the CDR system's 322 sampling point is still at its optimum point (digital signal processing (DSP) algorithms governs this) and system performance is intact when comparing it to power-hungry DDR-CDR architecture.

It will be understood by those skilled in the art that the foregoing general description and the following detailed description are exemplary and explanatory of the disclosure and are not intended to be restrictive thereof.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

The invention claimed is:

1. A Signal to Noise And Interference Ratio (SNAIR) aware-Analog to Digital Converter (ADC)-based-receiver, wherein the SNAIR aware-ADC based receiver comprises:
   an analog front end (AFE) configured for recovering an input data signal with a bit error rate (BER) below a target BER;
   a sampler communicatively coupled to the AFE, wherein the sampler is configured for receiving the input data signal from the AFE, sampling the received input data signal, and distributing the sampled input data signal to a sub-analog-to-digital converter (SADC) array;
   the SADC array communicatively coupled to the sampler, and wherein the SADC array comprises an array of identical analog-to-digital converters (ADCs) configured for converting the sampled input data signal into a digital data signal, and wherein the ADCs are time-interleaved for achieving a predetermined sampling frequency;
   a digital signal processing (DSP) unit communicatively coupled to the SADC array, wherein the DSP unit uses a baud rate sampling scheme, and wherein the DSP unit comprises:
   a feed forward equalizer (FFE) configured to remove residual inter-symbol interference (ISI) by multiplying a delayed version of the digital data signal with Htap values; and
   one or more-taps decision feedback equalizer (DFE) configured to remove remaining ISI caused by a first y previous symbols where y is the number of DFE taps using (n−1) decision levels at each of 'n' possible previous symbols, where n is the number of levels used in a PAM scheme;
   a baud rate sampling system communicatively coupled to the DSP unit, wherein the baud rate sampling system is configured to generate a plurality of error signals and data signals using an output of the one or more-taps decision feedback equalizer (DFE);
   a clock data recovery (CDR) system communicatively coupled to the baud rate sampling system, wherein the CDR system is configured to process the generated plurality of error signals and data signals for aligning a main sample clock with the input data signal and maximize a corresponding eye opening;
   an eye quality measurement system communicatively coupled to an output of the DSP unit, wherein the eye quality measurement system is configured to measure an eye quality of the input data signal by determining a margin estimation value and corresponding outer eye measurements associated with an eye; and
   a digital control communicatively coupled to each of the AFE, the sampler, the SADC array, the DSP unit, and the eye quality measurement system, wherein the digital control is operated by instructions from the DSP unit and is configured for:
      auto-calibrating each of the AFE, the sampler, the SADC array, and the eye quality measurement system; and
      optimizing performance of the AFE to recover the input data signal at the target BER.

2. The SNAIR aware-ADC based-receiver of claim 1, responsive to removing the ISI caused by the first previous y previous symbols where y is the number of DFE taps using the (n−1) decision levels at each of 'n' possible previous symbols, wherein n is the number of levels used in a PAM scheme, the one or more taps DFE is configured to:
   predetermine the ISI caused due to the first previous symbol; and
   determine a final data value based on the previous symbol decision d(n−1) and a current raw ADC output value is used to calculate d(n), where n is a number of symbols.

3. The SNAIR aware-ADC based-receiver of claim 1, wherein the baud rate sampling system is further configured to:
   de-multiplex one or more comparator outputs such that a data sample and an error sample are generated for each symbol of the input data signal by utilising a previous symbol decision; and
   generate the plurality of error signals by re-using at least one of a set of predetermined unused decisions along with a d(n−1)*$h_1$ value, wherein the plurality of error signals are generated for a maximum number of possible transitions in the input data signal.

4. The SNAIR aware-ADC based-receiver of claim 1, wherein the AFE comprises:
   a matching network configured for controlling a differential input impedance as compared to a predetermined value;
   an attenuator communicatively coupled to an output of the matching network, wherein the attenuator is configured for attenuating the input data signal into a predetermined range to ensure linearity of the input data signal, and wherein an amount of attenuation is dependent upon a predetermined signal-swing value, and wherein the amount of attenuation is calibrated at a link start-up using the DSP unit;
   a long tail equalizer (LTE) communicatively coupled to an output of the attenuator, wherein the LTE is configured to equalize low-frequency content in the input data signal and generate a long tail in a pulse response of the input data signal, and wherein the LTE is calibrated at the link start-up and in a mission mode using the DSP unit;
   a continuous time linear equalizer (CTLE) communicatively coupled to an output of the LTE, wherein the CTLE is configured to attenuate low frequency content of the input data signal between a direct current and a maximum frequency content of the input data signal, and wherein the CTLE is auto-calibrated using the DSP unit; and a variable gain amplifier (VGA) communicatively coupled to an output of the CTLE, wherein the VGA is configured to boost the signal swing value of the input data signal to a level in order for SNAIR to correspond to the target BER.

5. The SNAIR aware-ADC based-receiver of claim 1, further comprising:

a phase interpolator (PI) communicatively coupled to the sampler and the CDR system, wherein the PI is configured to rotate an input clock from at least one subset of a set comprising a phase-locked-loop (PLL) and a clock source to a specified phase relationship, and wherein the PI is controlled by a at least first-order loop implemented in the digital control; and a clock generation system communicatively coupled to the SADC array, wherein the clock generation system is configured to generate a specific lower frequency clock signal from a main sample clock derived from the CDR system and the clock source.

6. The SNAIR aware-ADC based-receiver of claim 1, wherein the DSP unit further comprises:

a linearity calibration system configured to:

determine whether the input data signal at an input of the SADC array comprises a non-linearity condition above a predetermined threshold value; and attenuate a signal swing value of the input data signal in the event that the non-linearity exceeds the predetermined threshold value.

7. The SNAIR aware-ADC based-receiver of claim 1, wherein the CDR system is further configured to track a phase of the input data signal continuously and determine an optimum sampling time for each received symbol of the input data signal.

8. The SNAIR aware-ADC based-receiver of claim 1, wherein the baud rate sampling system uses a baud rate architecture.

9. The SNAIR aware-ADC based-receiver of claim 1, wherein the CDR system further comprises:

a phase detector configured to transform the generated plurality of error signals and data signals into a subset of a set comprising: early votes, late votes, and no votes;

a voter configured to aggregate votes output from the phase detector; wherein the voter determines a most common vote amongst the aggregated votes, and wherein the voter forwards the determined most common vote to a first order digital filter; and the at least first order digital filter configured to generate a first input gain for a proportional path and a second input gain for an integral path, wherein an output of the at least first order digital filter is integrated to provide a phase interpolator (PI) code.

10. The SNAIR aware-ADC based-receiver of claim 1, wherein the CDR system further utilises an independent DFE from a main data path allowing the CDR $h_1$ to be set independently of a data path $h_1$ correction.

11. The SNAIR aware-ADC based-receiver of claim 1, respondent to measuring the eye quality of the input data signal by determining the margin estimation value and the corresponding outer eye measurements associated with the eye, the eye quality measurement system is further configured to:

split the input data signal to obtain an up-margin value and a down-margin value for a plurality of sub-eyes;

adapt one or more threshold values associated with the up-margin value and the down-margin value, wherein the threshold values are aligned to programmable BER threshold values;

determine an upBER value and a downBER value at a sample point corresponding to each of the up-margin values and the down-margin values by extrapolating a probabilities threshold value and adapted threshold values associated with the up-margin value and the down-margin value; and determine the margin estimation value of the eye based on the determined upBER value and the downBER value.

12. The SNAIR aware-ADC based-receiver of claim 1, wherein the digital control comprises a plurality of subsystems in the form of programmable instructions executable by the DSP unit, and wherein the plurality of subsystems comprises:

an adaptation subsystem configured to:

calibrate each element of the SADC array by determining a gain value and an offset value;

perform one or more initial calibrations with initial conditions to components of the AFE; and calibrate a CTLE and a VGA to increase an ability of the CDR system to lock by estimating a breakdown value of a power versus frequency value, wherein the breakdown value of the power versus the frequency value is calculated using a band power measurement subsystem, and wherein upon calculating the power versus frequency value of the sampled data, the CTLE is calibrated until power in each band is related by a programmable target ratio;

a CDR locking subsystem configured to lock the CDR system with a set of initial conditions;

a tap estimation subsystem configured to adapt the Htap values of the FFE by correlating the generated plurality of error signals and the delayed input data signal, wherein the Htap values are updated with a gain factor for maintaining a calibration-loop stability by using the correlated plurality of error signals and the delayed input data signal;

an eye-centering subsystem configured to center a sampling position of the input data signal by modifying a DFE correction value corresponding to the first previous symbol based on a majority of votes of each sub-eye asymmetry signals; and an AFE tuning subsystem configured to tune setting of the AFE to perform at a level corresponding to a level less than or equal to the target BER for recovering the input data signal at the target BER.

13. The SNAIR aware-ADC based-receiver of claim 12, wherein the CDR locking subsystem is configured to increase an acquisition range of a CDR loop using a higher CDR Proportional (1st order) path gain (Kprop) value, while maintaining CDR loop stability.

14. The SNAIR aware-ADC based-receiver of claim 12, wherein the digital control is configured to monitor SNAIR during operation and adapt to a predetermined threshold SNAIR target value for adapting across process, voltage, and temperature (PVT) variations.

15. The SNAIR aware-ADC based-receiver of claim 12, wherein the CDR subsystem is configured to align the eye position by adjusting the DFE correction value based on a majority vote of the eye asymmetry signals.

16. The SNAIR aware-ADC based-receiver of claim 12, wherein the band power measurement subsystem is configured at a link start-up time to filter the input data signal with a digital high-pass filter and a low-pass filter, wherein results of the high-pass filter are sent to a power measurement block, and wherein the filtered input signal is used to generate a power signal from a Fnyquist/2 to a Fnyquist value, and wherein the Fnyquist value corresponds to a sample rate/2, and wherein results of the low-pass filter are decimated by a factor of two and filtered using a second high- and low-pass filter in a recursive arrangement to measure one or more frequency bands of interest.

17. A method for recovery a signal transmitted over a channel using a signal to noise and interference ratio (SNAIR) aware-analog to digital (ADC)-based-receiver, the method comprising:

calibrating a sub-analog-to-digital converter (SADC) array for determining a gain value and an offset value for each element and also of an input data signal, wherein the SADC array is comprised of an array of identical analog-to-digital converters (ADCs), and wherein each ADC is configured for converting the input data signal into a digital data signal, and wherein the ADCs are time-interleaved for achieving a predetermined sampling frequency;

performing initial calibrations with initial conditions to components of an analog front end (AFE), wherein the components of the AFE are comprised of a matching network, an attenuator, a long tail equalizer (LTE), a continuous time linear equalizer (CTLE), and a variable gain amplifier (VGA);

calibrating the CTLE and the VGA to increase an ability of a clock data recovery (CDR) system to lock by estimating a breakdown value of a power versus frequency value, wherein the breakdown value of the power versus the frequency value is estimated using a band power measurement subsystem, and wherein upon estimating the breakdown value of the power versus the frequency value, the CTLE is calibrated until power in each band is at a target ratio nominally equal;

locking the CDR system with initial conditions upon calibrating the CTLE and the VGA;

adapting Htap values of a feed forward equalizer (FFE) by correlating a plurality of error signals and a delayed input data signal, wherein the Htap values are updated with a gain factor for maintaining calibration loop stability by using the correlated plurality of error signals and the delayed input data signal;

centering an eye position of the input data signal by modifying a pulse response at a unit interval ($h_1$) value based on a majority of votes of each sub-eye asymmetry signals; and tuning settings of the AFE to perform at a level corresponding to at least one of a level equal to a level less than a target bit error rate (BER) for recovering the input data signal at the target BER.

18. The method of claim 17, wherein locking the CDR system with initial conditions upon calibrating the CTLE and the VGA comprises increasing an acquisition range of the clock data recovery (CDR) during the CDR system lock operation using a higher CDR Proportional (1st order) path gain (Kprop) value, while maintaining the CDR loop stability.

19. The method of claim 17, further comprising:
monitoring a SNAIR during operation; and
adapting to a predetermined SNAIR target value for adapting across process, voltage, and temperature (PVT) variations.

20. The method of claim 17, wherein centering the eye position of the input data signal comprises centering the eye position by adjusting the $h_1$ value based on a majority vote of the eye asymmetry signals.

* * * * *